US 6,714,374 B1

United States Patent
Hayashi et al.

(10) Patent No.: US 6,714,374 B1
(45) Date of Patent: Mar. 30, 2004

(54) MAGNETORESISTIVE SENSOR, MAGNETORESISTIVE HEAD, AND MAGNETIC RECORDING/REPRODUCING APPARATUS

(75) Inventors: Kazuhiko Hayashi, Tokyo (JP); Keishi Ohashi, Tokyo (JP); Stuart Solin, Princeton Junction, NJ (US); Tao Zhou, Plainsboro, NJ (US)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/652,821

(22) Filed: Aug. 31, 2000

(51) Int. Cl.[7] ............................................. G11B 5/03
(52) U.S. Cl. ................. 360/66; 360/319; 360/322; 324/252; 338/32 R
(58) Field of Search .............. 338/32 R; 324/252; 360/66, 55, 313, 324, 317, 318, 318.1, 319, 322, 326, 327.1, 327.2, 327.23, 327.3, 327.31

(56) References Cited

U.S. PATENT DOCUMENTS

| | | | |
|---|---|---|---|
| 3,617,975 A | 11/1971 | Wieder et al. | |
| 4,577,250 A | 3/1986 | Sato et al. | |
| 4,772,929 A | 9/1988 | Manchester | |
| 4,828,966 A | 5/1989 | Mallary et al. | |
| 4,949,039 A | 8/1990 | Grünberg | |
| 5,604,651 A | * 2/1997 | Asselin | 360/322 |
| 5,622,874 A | 4/1997 | Seider et al. | |
| 5,696,655 A | 12/1997 | Kawano et al. | |
| 5,699,215 A | 12/1997 | Solin et al. | |
| 5,815,342 A | 9/1998 | Akiyama et al. | |
| 5,880,912 A | * 3/1999 | Rottmayer | 360/324 |
| 5,930,062 A | 7/1999 | Davidson | |
| 5,965,283 A | 10/1999 | Solin et al. | |

FOREIGN PATENT DOCUMENTS

| | | |
|---|---|---|
| EP | 0 404 332 A2 | 12/1990 |
| FR | 2 747 497 | 10/1997 |
| GB | 1 320 857 | 6/1973 |

OTHER PUBLICATIONS

Patent Abstracts of Japan, vol. 1999, No. 03, Mar. 31, 1999 & JP 10 334440A (Hitachi Ltd.), Dec. 18, 1998.
D.A. Thompson, "Thin Film Magnetoresistors In Memory, Storage, and Related Applications", IEEE Trans. on Mag., vol. Mag 11, p 1039–1050 (Jul. 1975).
C.M. Wolfe, et al., "High Apparent Mobility in Inhomogeneous Semiconductors", Solid State Science and Technology, pp 250–255 (Feb. 1972).

* cited by examiner

*Primary Examiner*—Alan T. Faber
(74) *Attorney, Agent, or Firm*—Scully, Scott, Murphy & Presser

(57) ABSTRACT

A magnetoresistive sensor includes a magnetoresistive element and equipment which generates a magnetic field in the magnetoresistive element thereby inducing a biasing magnetic field in the element, where the magnetoresistive element comprises a high electron mobility semiconductor and electrodes which are connected to the semiconductor. If it is an insulator, the equipment, which generates the biasing magnetic field and supplies it to the magnetoresistive element, may contact directly to the magnetoresistive element. If it is a conductor, an insulating separation layer must be set between the equipment and the element. A magnetoresistive element is representatively Corbino disk type or a bar type magnetoresistive element. Another candidate of the magnetoresistive element is an element consisting of a high electron mobility semiconductor, a pair of electrodes which make a current path in the high electron mobility semiconductor, and another pair of electrodes to detect the induced voltage by the current.

90 Claims, 40 Drawing Sheets

Fig. 4a
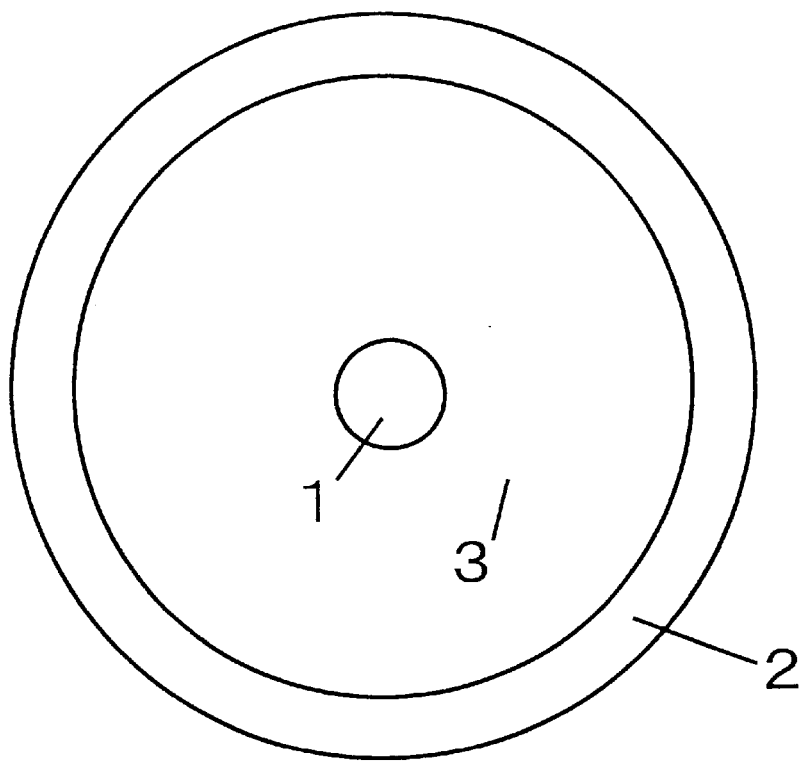
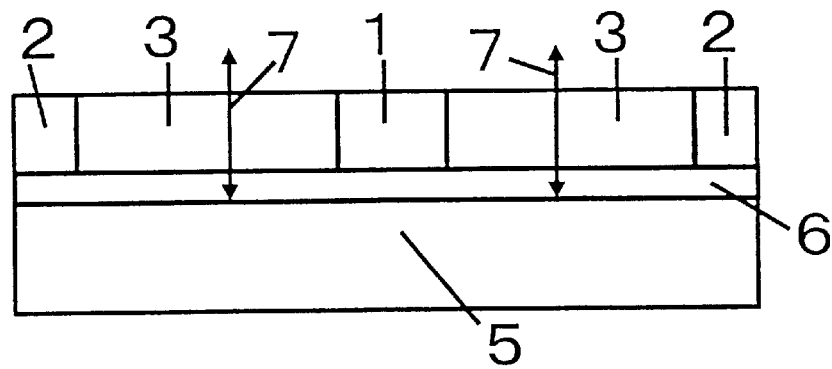
Fig. 4b

Fig. 5a
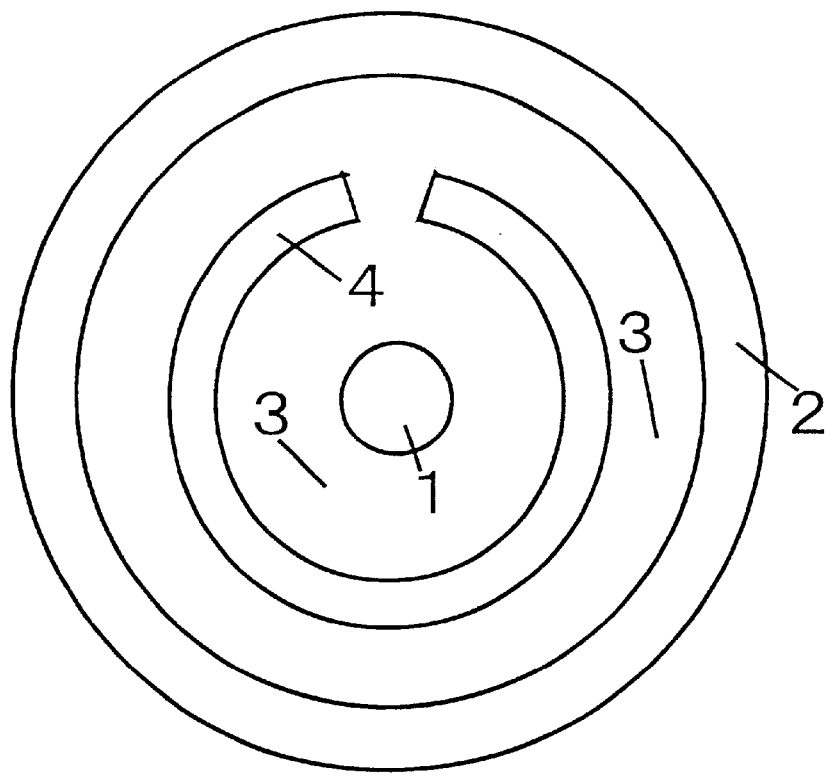
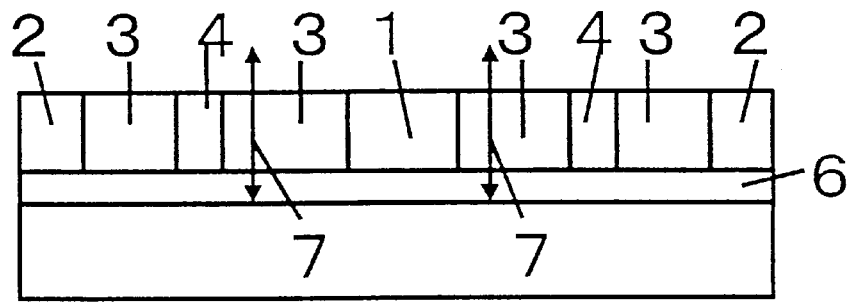
Fig. 5b

Fig. 18a
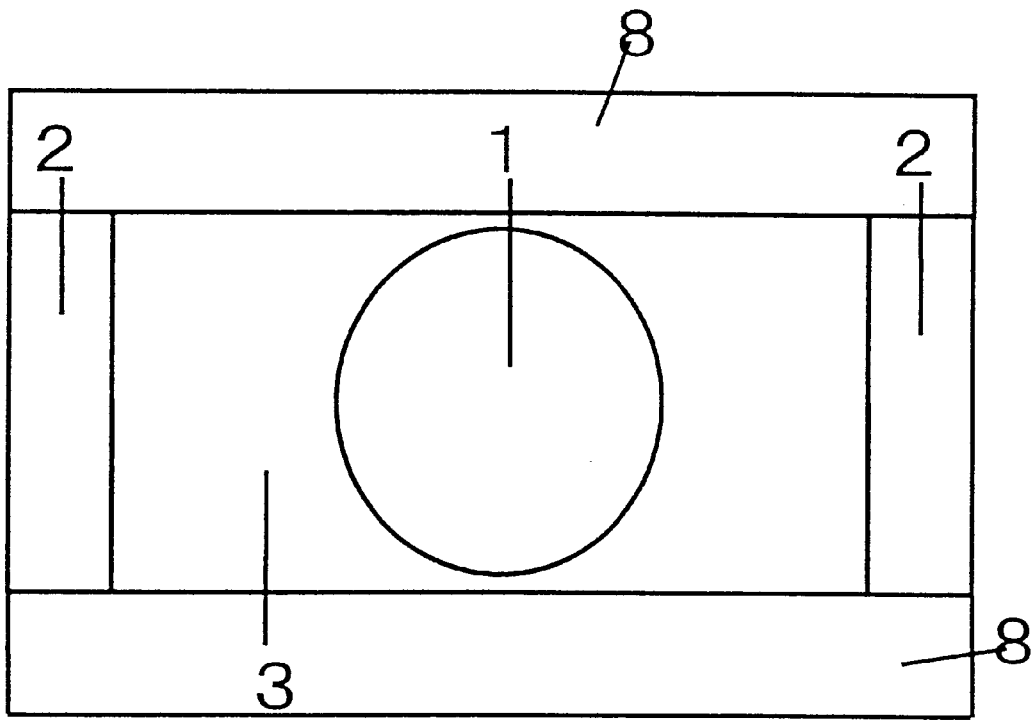
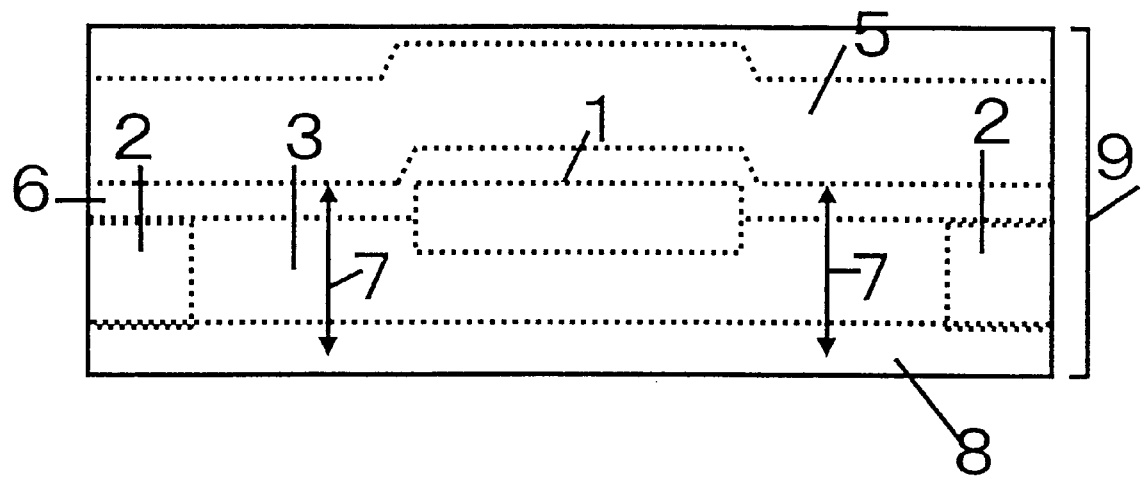
Fig. 18b

Fig. 19a
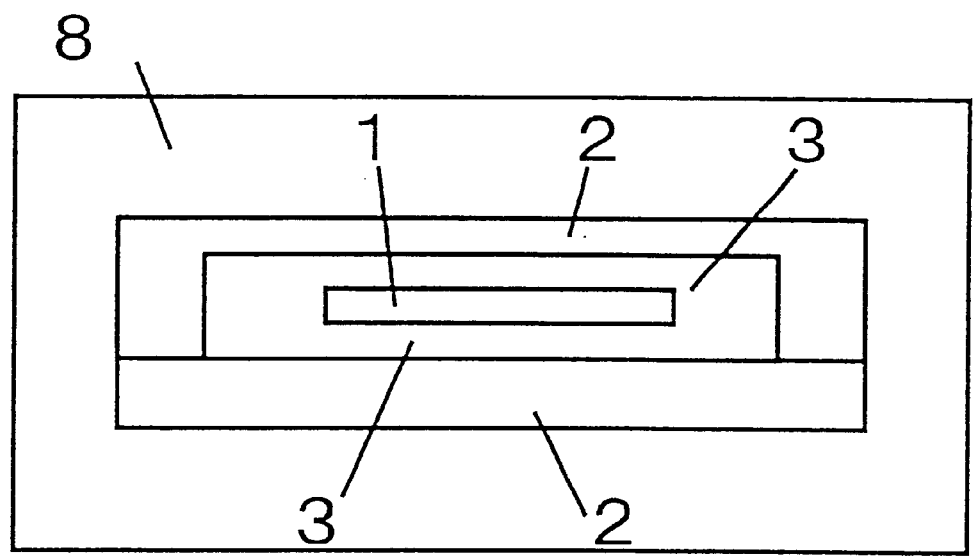
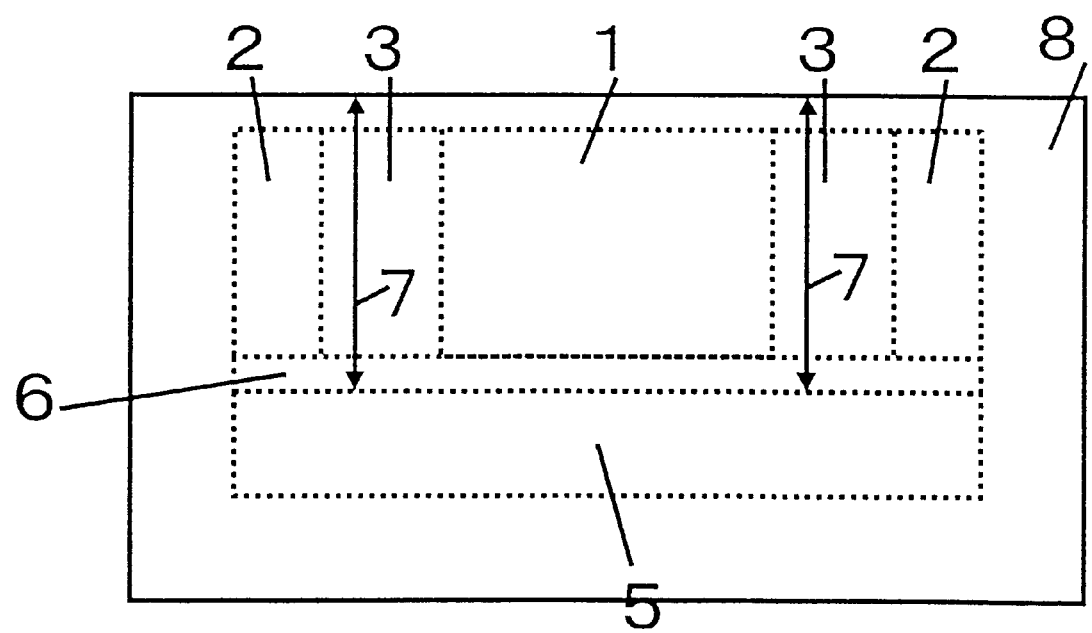
Fig. 19b

Fig. 20a
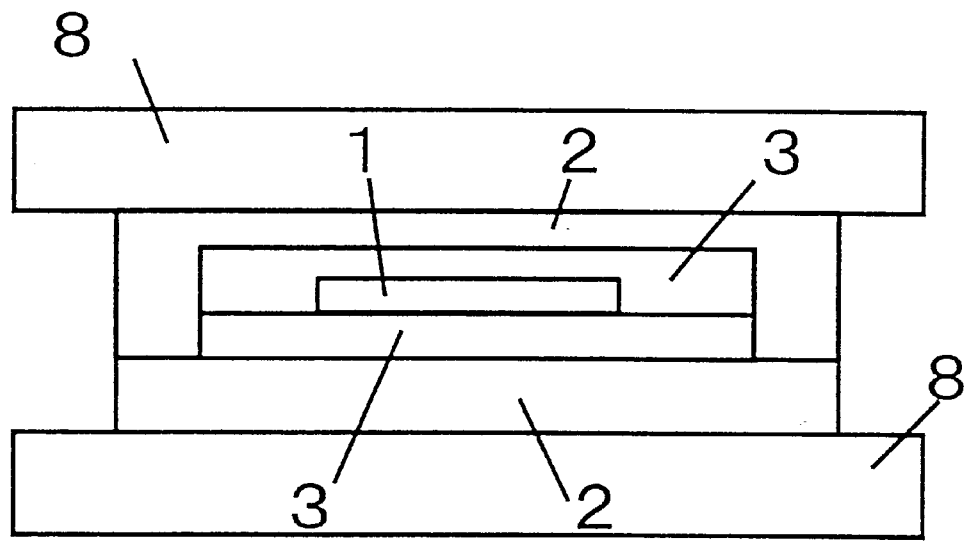
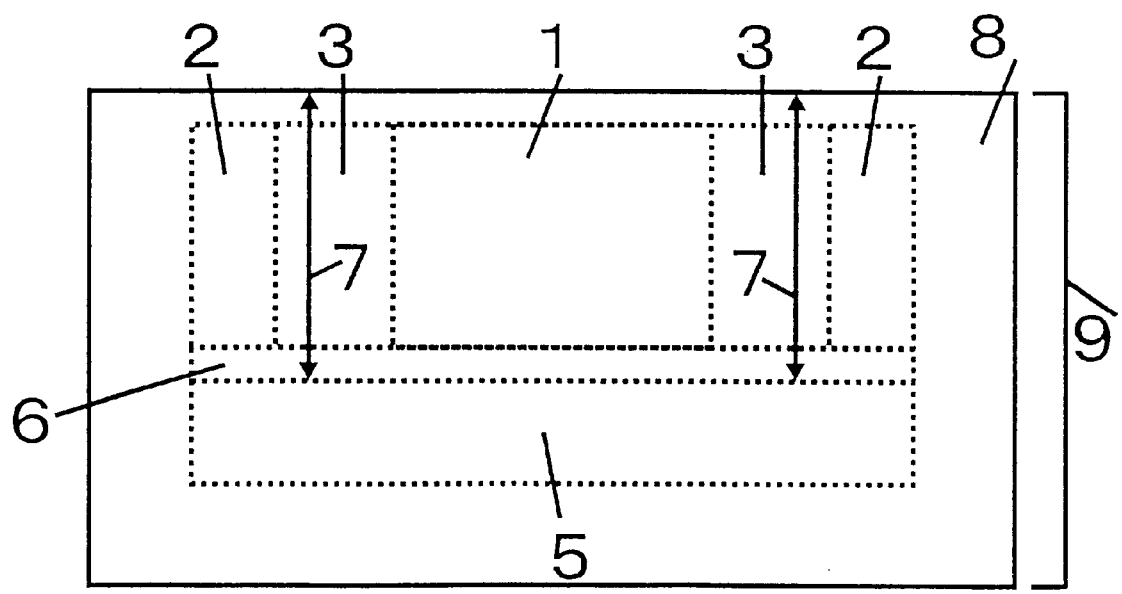
Fig. 20b

MAGNETORESISTIVE SENSOR, MAGNETORESISTIVE HEAD, AND MAGNETIC RECORDING/REPRODUCING APPARATUS

BACKGROUND OF THE INVENTION

1. Field of the Invention

The present invention relates to a magnetoresistive element, magnetoresistive head and magnetic recording/reproducing apparatus and, in particular, a magnetoresistive element for reading an information signal recorded on a magnetic recording medium, a magnetoresistive head, and a magnetic recording/reproducing apparatus.

2. Description of the Related Art

Conventionally, there has been disclosed a magnetic reading converter called an magnetoresistive sensor or magnetoresistive head as a component of a hard disk drive. These can read data from a magnetic surface with a large linear density.

The magnetoresistive sensor detects a magnetic field signal according to a resistance change as a function of intensity and direction of a magnetic flux detected by a read element. Such a conventional magnetoresistive sensor operates according to the effect of anisotropic magneto resistance (AMR) in such a way that a component of resistance of the read element changes in proportion to the square of the cosine of the angle between the magnetization direction and the sense current direction flowing in the element. The AMR effect is detailed in D. A. Thompson, "Thin Film Magnetoresistors In Memory, Storage, and Related Applications", IEEE Trans. on Mag., Vol. Mag 11, P 1039–1050, (July 1975). In a magnetic head using the AMR effect, longitudinal bias is often applied in order to suppress the Barkhausen noise. The longitudinal bias may be realized by an antiferromagnetic material such as FeMn, NiMn, nickel oxide or the like.

Furthermore, more remarkable magneto-resistivity has been disclosed. That is, the resistance change of a layered magnetic sensor is based on a spin dependent transmission of conductive electrons between magnetic layers via a non-magnetic layer and accompanying spin dependent scattering on the layer boundary. Such a magneto-resistivity is called giant magneto-resistivity, spin-valve effect, and the like. Such a magnetoresistive sensor is made from an appropriate material and enables one to improve the sensitivity and increase the resistance change in comparison with a sensor using the AMR effect.

In this type of magnetoresistive sensor, the resistance of a plane between a pair of ferromagnetic layers separated by a non-magnetic layer changes in proportion to the cosine of an angle defined by the magnetization directions in the two ferromagnetic layers.

On the other hand, U.S. Pat. No. 4,949,039 (corresponding to EPO Patent Publication 0 346 817A2 published on Dec. 20, 1989 and Japanese Patent Publication 2-61572 dated Mar. 1, 1990) discloses a layered magnetic configuration which brings about a high magneto-resistance change generated by parallel or anti-parallel arrangement of magnetization in the magnetic layers. The layered configuration is made from ferromagnetic transition metals or alloys.

Magnetoresistive sensors including semiconductor material and electrodes are also disclosed.

A magnetoresistive element including Van der Pauw configuration semiconductor element is shown in C. M. Wolfe, et al., "High Apparent Mobility in Inhomogeneous Semiconductors", Solid State Science and Technology, pp 250–255 (February 1972).

U.S. Pat. Nos. 5,696,655, 5,699,215, 5,965,283 disclose a magnetoresistive sensor (see FIG. 1) composed of basic elements of high electron mobility semiconductor 3 and electrodes 1, 2 which define a sense current path through the high electron mobility semiconductor 3 and detect the voltage between electrode 1 and electrode 2.

As representative magnetoresistive elements including a high electron mobility semiconductor 3, a Corbino type element and a Van der Pauw element are known.

FIG. 1 shows a representative Corbino type element. The shape of this kind of element is typically a cylinder. There are two electrodes, electrode 1 is in the cylinder and electrode 2 is on the outer surface of the cylinder. The space between the two electrodes is filled with high electron mobility semiconductor 3.

FIG. 2 shows a representative Van der Pauw type element. This kind of element typically consists of a cylindrical high electron mobility semiconductor 11 mounted on a substrate 13. A high electron conduction material 10 is buried in the cylindrical high electron mobility semiconductor 11. The element includes a pair of electrodes 12 which make a current path in the cylindrical high electron mobility semiconductor 11 and in the high conduction material 10, and another pair of electrodes 12a to detect the voltage induced by the current to generate a magnetic field 14 for detection.

These two types of elements exhibit a magnetoresistive change typically like that shown in FIG. 3. The resistance of an element is minimum when an applied field is near zero. The resistance of an element increases when an applied field increases in either the plus direction or the minus direction. The low field magneto-resistance is quadratic. It is necessary to provide over 0.1 T biasing, or if permitted over 0.2 T biasing, to a) distinguish the direction of the applied field (e.g. up or down), b) to enhance the sensitivity of the sensor and c) to obtain a linear response close to an external field H=0. Then, it is important to add or attach an entity which generates a biasing magnetic field, to the element, in order to use it as a magnetic read head.

However, it is not sufficient to add as large a biasing magnetic field as possible. There is a limit to the biasing magnetic field value, because too large a biasing magnetic field may cause a reversal of magnetization of a recording media and destroy pre-recorded data. Thus, it is also important that a biasing magnetic field be below the field value leads to a destruction of data.

SUMMARY OF THE INVENTION

The magnetoresistive sensor includes a magnetoresistive element and equipment which generates a magnetic field in the magnetoresistive element thereby inducing a biasing magnetic field in the element, where the magnetoresistive element comprises a high electron mobility semiconductor and electrodes which are connected to the semiconductor.

If it is an insulator, the equipment, which generates the biasing magnetic field and supplies it to the magnetoresistive element, may contact directly to the magnetoresistive element. If it is a conductor, an insulating separation layer must be set between the equipment and the element.

A magnetoresistive element is representatively Corbino disk type or a bar type magnetoresistive element. Another candidate of the magnetoresistive element is an element consisting of a high electron mobility semiconductor, a pair of electrodes which make a current path in the high electron mobility semiconductor, and another pair of electrodes to detect the induced voltage by the current.

The value of the magnetic field applied from the equipment to the element is over 1 kOe, preferably over 2 kOe.

The magnetoresistive sensor is used as a part of a reproducing head in two types of magnetic recording/reproducing systems. One is a system where a magnetization direction in a recording media magnetic domain bit is parallel or anti-parallel to the moving direction of the media. Another one is a system where a magnetization direction in a recorded magnetic domain bit in a recording media is perpendicular or nearly perpendicular to the surface of the media. In either system, the amplitude of a magnetic field on the surface of the recording media induced by the equipment has to be smaller than one where the magnetic domain wall of a pre-recorded magnetic domain bit starts to move. In that case, the amplitude of the magnetic field applied from the equipment to the medium is less than the coercive force and reversal field of the medium.

The coercive force of the medium should be larger than 3 kOe, preferably larger than 5 kOe. A part of the upper or lower pole of a recording head in the recording/reproducing system is made from a magnetic material in which the saturation magnetization is larger than 1.8T. NiFeCo alloy is suitable for this material.

The magnetic recording/reproducing apparatus according to the present invention comprises: a magnetic recording medium having a plurality of tracks for recording data; a magnetic recording head for storing data in the magnetic recording medium; the magnetoresistive head; and actuator means for moving the magnetic recording head and the magnetoresistive head to a desired track on the magnetic recording medium.

Moreover, the magnetic recording medium may be a hard disk.

BRIEF DESCRIPTION-OF THE DRAWINGS

FIGS. 4a and 4b show a magnetoresistive element of the present invention.

FIGS. 5a and 5b show a magnetoresistive element of the present invention.

FIGS. 9a and 9b are plane views of variations of the magnetoresistive element of the present invention of FIG. 8.

FIG. 15-1 is a cross sectional view of a magnetoresistive element of the present invention.

FIG. 15-2 is a cross sectional view of a magnetoresistive element of the present invention.

FIG. 15-3 is a cross sectional view of a magnetoresistive element of the present invention.

FIG. 15-4 is a cross sectional view of a magnetoresistive element of the present invention.

FIGS. 18a and 18b show a magnetoresistive element of the present invention.

FIGS. 19a and 19b show a magnetoresistive element of the present invention.

FIGS. 20a and 20b show a magnetoresistive element of the present invention.

FIG. 23-1 is a side view of a magnetoresistive element of the present invention.

FIG. 23-2 is a side view of a magnetoresistive element of the present invention.

FIG. 23-3 is a side view of a magnetoresistive element of the present invention.

FIG. 23-4 is a side view of a magnetoresistive element of the present invention.

FIG. 26-1 shows a typical procedure of fabricating a head using a high electron mobility semiconductor element of the present invention.

FIG. 26-2 shows a typical procedure of fabricating a head using a high electron mobility semiconductor element of the present invention.

FIG. 26-3 shows a typical procedure of fabricating a head using a high electron mobility semiconductor element of the present invention.

FIG. 26-4 shows a typical procedure of fabricating a head using a high electron mobility semiconductor element of the present invention.

FIG. 26-5 shows a typical procedure of fabricating a head using a high electron mobility semiconductor element of the present invention.

FIG. 26-6 shows a typical procedure of fabricating a head using a high electron mobility semiconductor element of the present invention.

FIG. 27-1 shows a typical procedure of fabricating a head using a high electron mobility semiconductor element of the present invention.

FIG. 27-2 shows a typical procedure of fabricating a head using a high electron mobility semiconductor element of the present invention.

FIG. 27-3 shows a typical procedure of fabricating a head using a high electron mobility semiconductor element of the present invention.

FIG. 27-4 shows a typical procedure of fabricating a head using a high electron mobility semiconductor element of the present invention.

FIG. 27-5 shows a typical procedure of fabricating a head using a high electron mobility semiconductor element of the present invention.

FIG. 27-6 shows a typical procedure of fabricating a head using a high electron mobility semiconductor element of the present invention.

FIG. 27-7 shows a typical procedure of fabricating a head using a high electron mobility semiconductor element of the present invention.

FIG. 27-8 shows a typical procedure of fabricating a head using a high electron mobility semiconductor element of the present invention.

FIG. 27-9 shows a typical procedure of fabricating a head using a high electron mobility semiconductor element of the present invention.

FIG. 27-10 shows a typical procedure of fabricating a head using a high electron mobility semiconductor element of the present invention.

DESCRIPTION OF THE PREFERRED EMBODIMENTS

Figure 1:
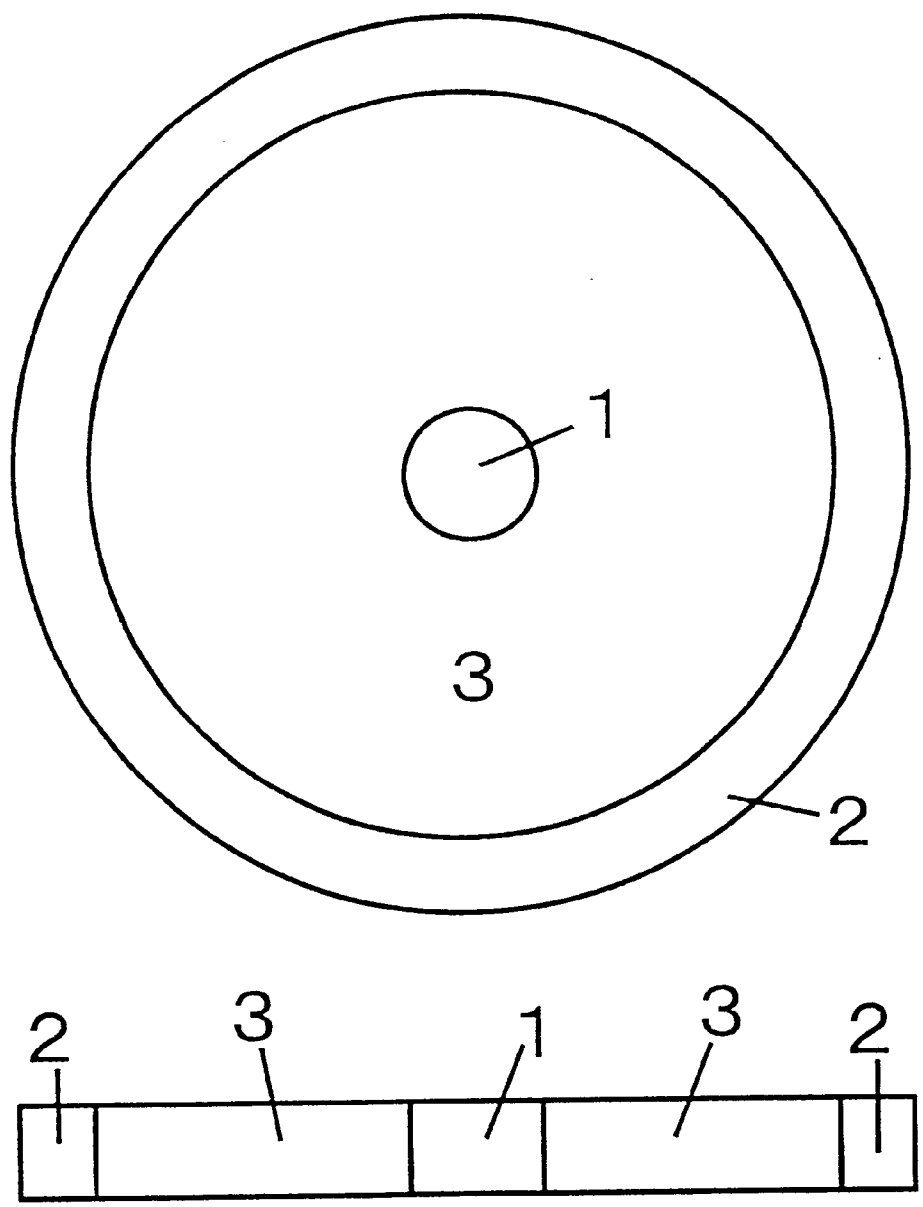
FIG. 1 shows a conventional high electron mobility semiconductor magnetoresistive element of the prior art.

A description will now be directed to preferred embodiments with reference to the attached drawings.

FIGS. 4a and 4b show an embodiment of the present invention. In this case, a cylindrical Corbino type element is used as a magnetoresistive element. As shown in FIGS. 4a and 4b, the Corbino type element comprises a first electrode 1 which is located near the center of the cylinder, a second electrode 2 which is located on the surface of the cylinder, and a high electron mobility semiconductor 3 embedded between the first electrode 1 and the second electrode 2. A sense current is set to flow from the first electrode 1 to the second electrode 2 or from the second electrode 2 to the first electrode 1. This element can detect the magnetic field, which direction is parallel or nearly parallel to the axis direction of the cylinder. When a magnetic field in said direction is applied to the element, the resistance between the first electrode 1 and the second electrode 2 changes. A spacer 6 is set under the element, and a biasing magnet 5 is set under the spacer 6. A biasing magnetic field 7 which is parallel or nearly parallel to the longitudinal axis direction of the cylinder is supplied from the biasing magnet 5 to the element thereby inducing a biasing magnetic field in the element. A high output voltage is to be obtained by using a good linear response in the magnetoresistive curve, when the amplitude of the biasing magnetic field 7 is optimized. The spacer 6 is used to prevent an electrical short circuit between the first electrode 1 and the second electrode 2 through the biasing magnet 5, or is used to set a space between the element and the biasing magnet 5 so as to optimize the amplitude of the biasing magnetic field 7 in the Corbino type element. In some cases, a spacer 6 can be removed.

Figures 1, 26:
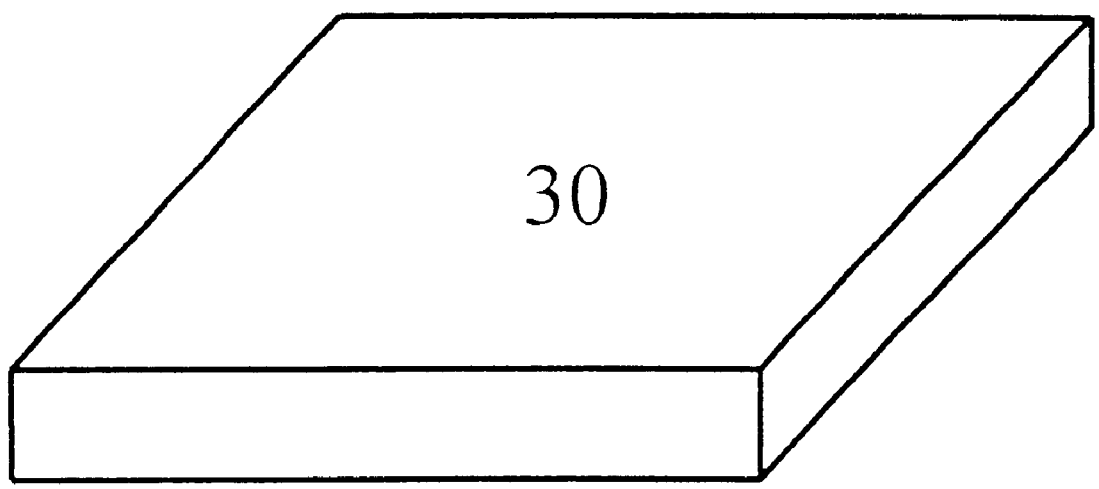
Figures 2, 26:
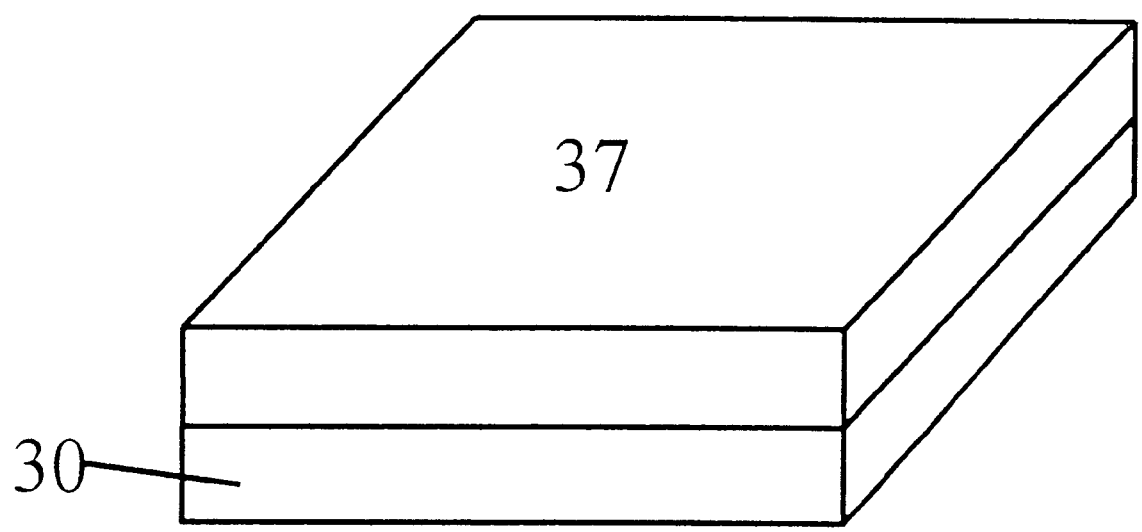
Figures 3, 26:
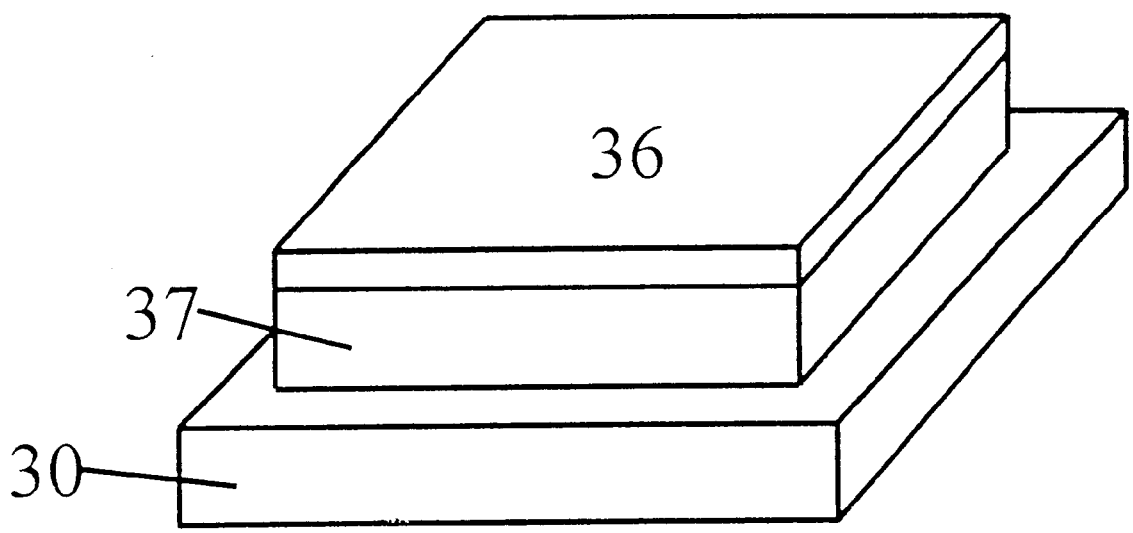
Figures 4, 26:
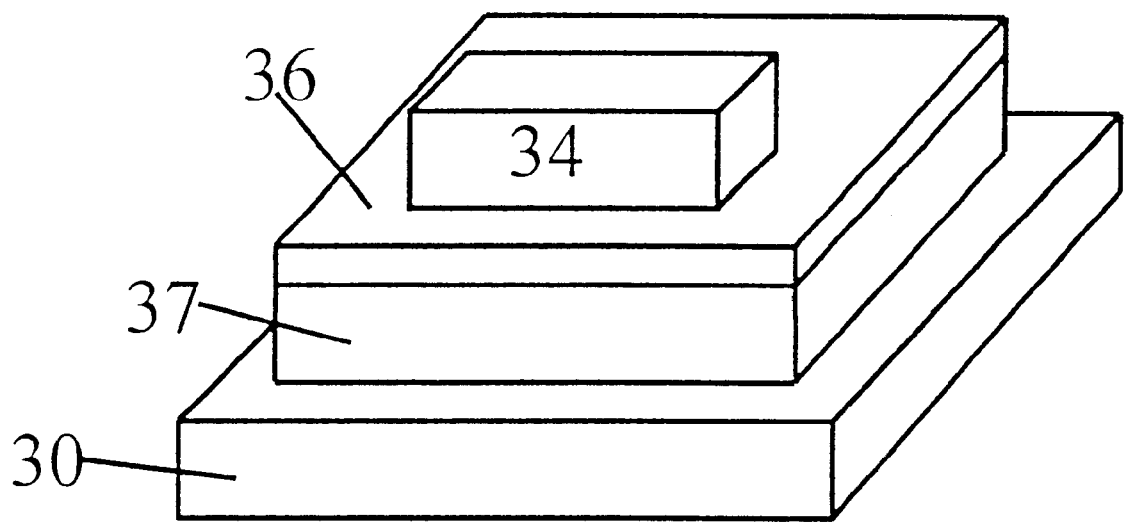
Figures 5, 26:
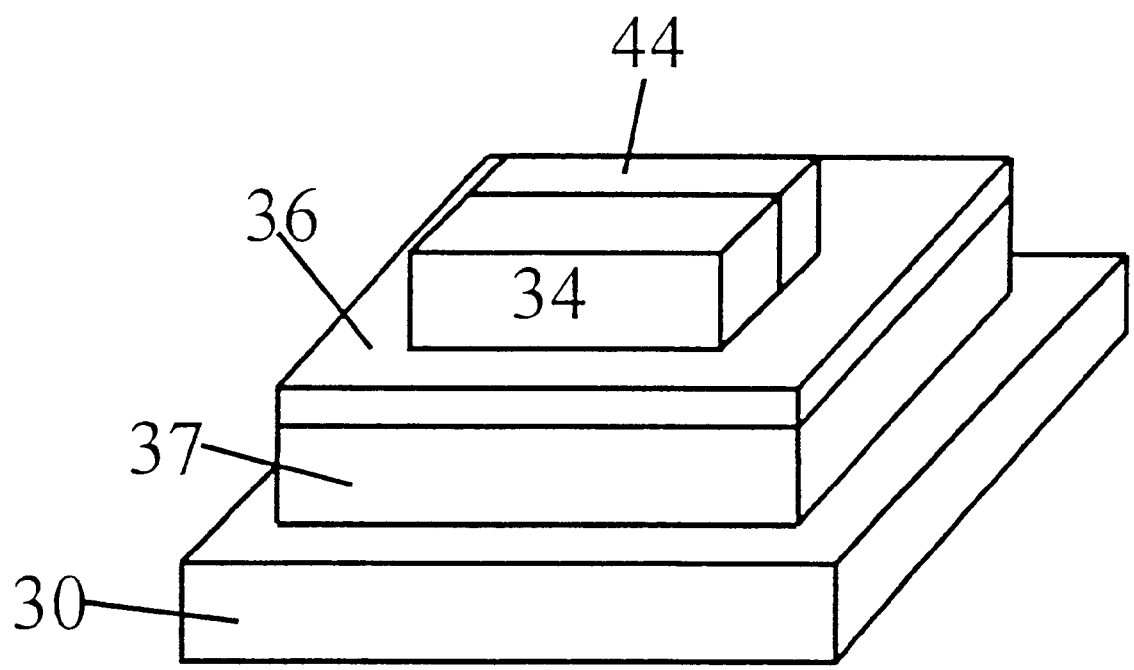

FIGS. 5a and 5b show an embodiment of the present invention. As shown in FIGS. 5a and 5b, a Corbino type element comprises a first electrode 1 which is located in the center or near the center of the cylinder, a second electrode 2 which is located on the surface near the edge of the cylinder, a high conduction material 4 which is set between the first electrode 1 and the second electrode 2, and a high electron mobility semiconductor 3 embedded between, the first electrode 1 and the high conduction material 4, and the high conduction material 4 and the second electrode 2. A sense current is set to flow from the first electrode 1 to the second electrode 2, or from the second electrode 2 to the first electrode 1. This element can detect the magnetic field, which direction is parallel or nearly parallel to the longitudinal axis direction of the cylinder. When a magnetic field in said direction is applied to the element, the resistance between the first electrode 1 and the second electrode 2 changes. A spacer 6 is set under the element, and a biasing magnet 5 is set under the spacer 6. A biasing magnetic field 7 which is parallel or nearly parallel to the longitudinal axis direction of the cylinder is supplied from the biasing magnet 5 to the element thereby inducing a biasing magnetic field in the element. A high output voltage is to be obtained using a good linear response in the magnetoresistance curve, when the amplitude of the biasing magnetic field 7 is optimized. The spacer 6 is used to prevent an electrical short circuit between the first electrode 1 and the second electrode 2 through the biasing magnet 5, or is used to set a space between the element and the biasing magnet 5 so as to optimize the amplitude of the biasing magnetic field 7 in the Corbino type element. In some cases, spacer 6 can be removed. In the example shown in FIG. 5, the high conduction material ring is cut, but there are cases that the high conduction material ring is not cut.

Figures 6A, 6B:
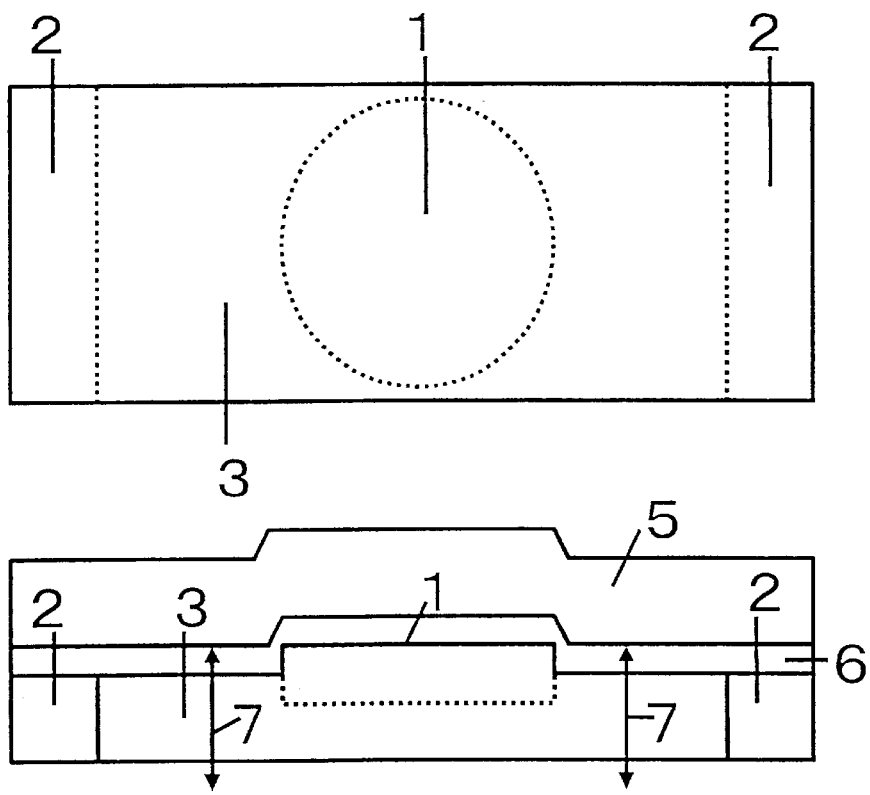
FIGS. 6a and 6b show a magnetoresistive element of the present invention

FIGS. 6a and 6b show an embodiment of the present invention. In this case, bar type element is used as a magnetoresistive element. As shown in FIGS. 6a and 6b, the bar type element comprises a first electrode 1 which is located in the center or near the center of the bar type element, two second electrodes 2 which are located on the edge of the bar, and a high electrode mobility semiconductor 3 embedded between the high conduction material and the second electrodes 2. A sense current is set to flow from the first electrode 1 to the second electrodes 2 or from the second electrodes 2 to the first electrode 1. This element can detect the magnetic field, which direction is perpendicular or nearly perpendicular to the surface of the first electrode 1.

Figures 6, 26:
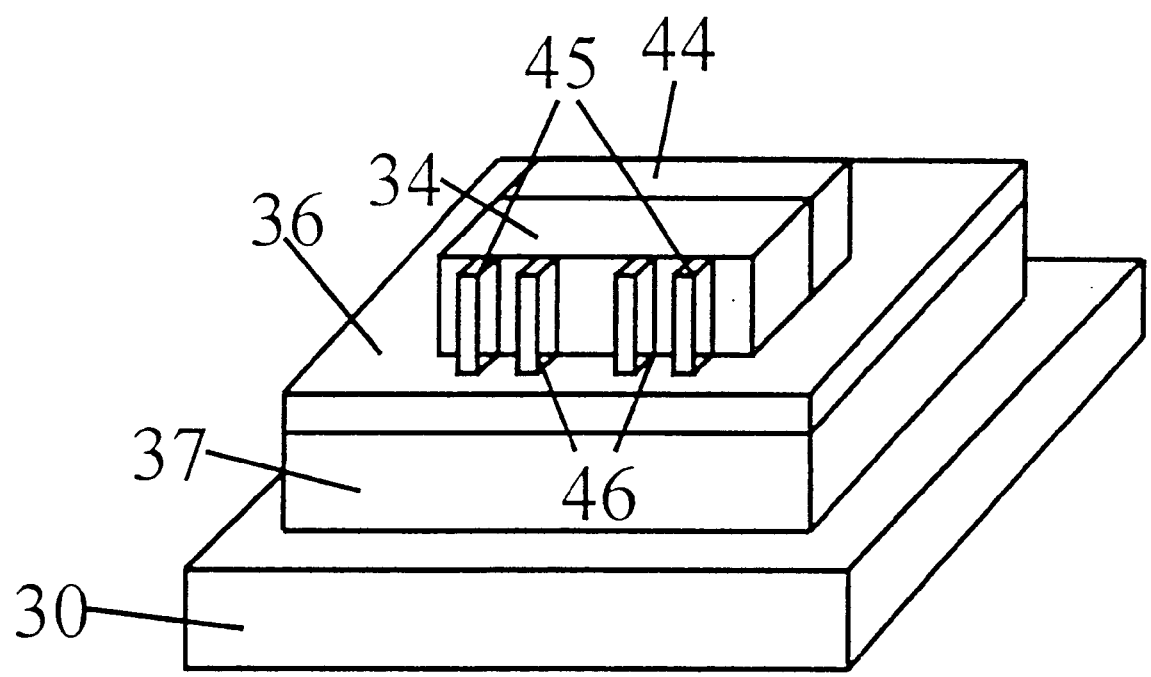

When a magnetic field in said direction is applied to the element, the resistance between the first electrode 1 and the second electrodes 2 change. A spacer 6 is set under the element and a biasing magnet 5 is set under the spacer 6. A biasing magnetic field 7 which is parallel or nearly parallel to the direction shown in FIG. 6 is supplied from the biasing magnet 5 to the element thereby inducing a biasing magnetic field in the element. A high output voltage is to be obtained by using a good linear response in the magnetoresistive curve, when the amplitude of the biasing magnetic field 7 is optimized. The spacer 6 is used to prevent an electrical short circuit between the first electrode 1 and the second electrodes 2 through the biasing magnet 5, or is used to set a space between the element and the biasing magnet 5 so as to optimize the amplitude of the biasing magnetic field 7 in the bar type element. In some cases, spacer 6 can be removed. In the example shown in FIG. 6., the first electrode 1 is partially buried into the high electron mobility semiconductor 3. However, the configuration in which the first electrode 1 is not buried in the high electron mobility semiconductor 3, and the configuration in which the first electrode 1 is completely buried into the high electron mobility semiconductor 3, are possible.

Figure 7A:
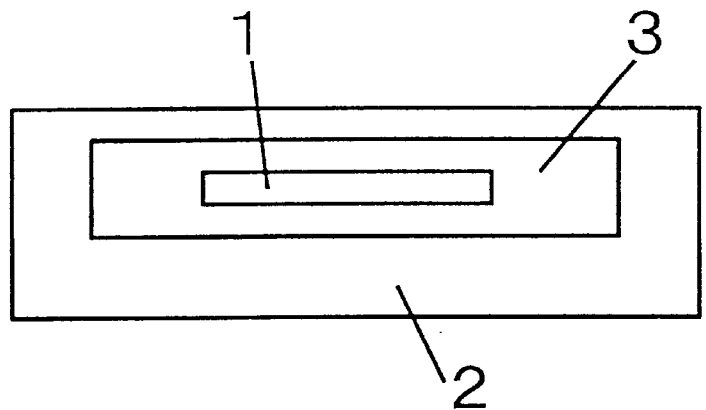
FIGS. 7a and 7b show a magnetoresistive element of the present invention.
Figure 7B:
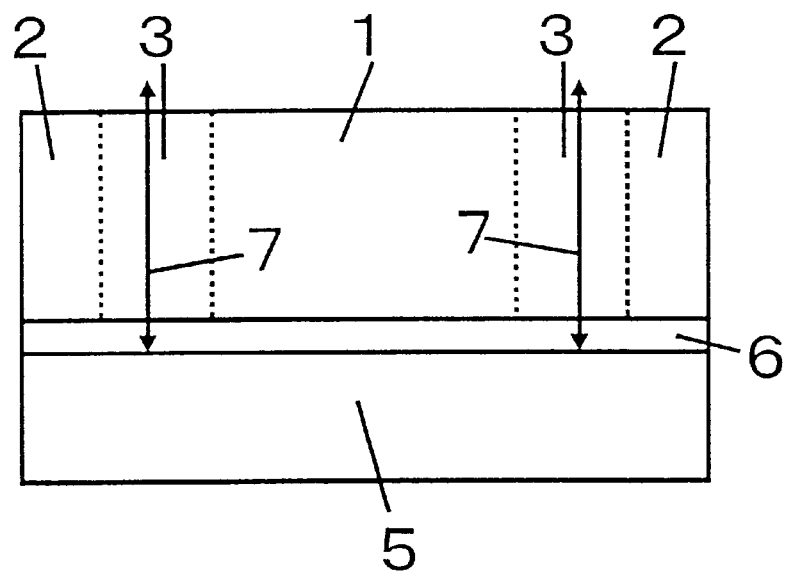

FIGS. 7a and 7b show an embodiment of the present invention. In this case, a Corbino element which is not cylindrical is used as a magnetoresistive element. As shown in FIGS. 7a and 7b, this Corbino element comprises a first electrode 1 which is located in the center or near the center of the element, two second electrodes 2 which are located on the surface of the element at the edges thereof, and a high electron mobility semiconductor 3 embedded between the first electrode 1 and the second electrode 2. A sense current is set to flow from the first electrode 1 to the second electrode 2 or from the second electrode 2 to the first electrode 1. This element can detect the magnetic field, which direction is parallel or nearly parallel to the direction perpendicular to the surface of the first electrode 1. When a magnetic field in said direction is applied to the element, the resistance between the first electrode 1 and the second electrodes 2 changes. A spacer 6 is set under the element and a biasing magnet 5 is set under the spacer 6. A biasing magnetic field 7 which is parallel or nearly parallel to the direction shown in FIG. 7b is supplied from the biasing magnet 5 to the element thereby inducing a biasing magnetic field in the element. A high output voltage is to be obtained by using a good linear response in the magnetoresistive curve, when the amplitude of the biasing magnetic field 7 is optimized. The spacer 6 is used to prevent an electrical short circuit between the first electrode 1 and the second electrode 2 through the biasing magnet 5, or is used to set a space between the element and the biasing magnet 5 so as to optimize the amplitude of the biasing magnetic field 7 in the element. In some cases, spacer 6 can be removed.

Figure 8:
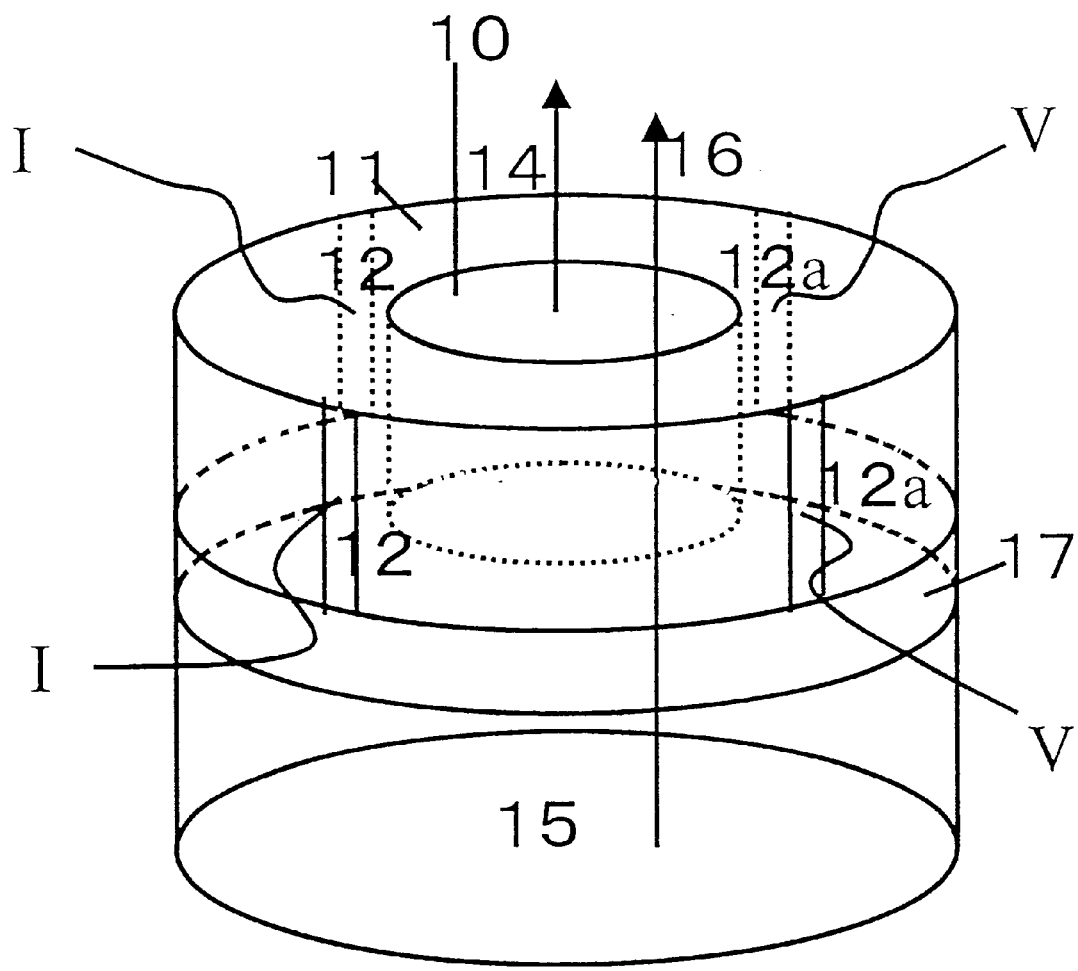
FIG. 8 shows a magnetoresistive element of the present invention.

FIG. 8 shows an embodiment of the present invention. In this case, a cylindrical van der Pauw element is used as a magnetoresistive element. As shown in FIG. 8, this van der Pauw element comprises a cylindrical high electron mobility semiconductor 11, a high electron conduction material 10 embedded in the cylindrical high electron mobility semiconductor 11, a pair of electrodes 12 which makes a current path in the cylindrical high electron mobility semiconductor 11 and in the high conduction material 10, and another pair of electrodes 12a to detect the induced voltage by the current. This element can detect the magnetic field 14, which direction is parallel or nearly parallel to the longitudunal axis of the cylinder. When a magnetic field in said direction is applied to the element, the voltage between the electrodes to detect the induced voltage by the current changes. A spacer 17 is set under the element and a biasing magnet 15 is set under the spacer 17. A biasing magnetic field 16 which is parallel or nearly parallel to the direction shown in FIG. 8 is supplied from the biasing magnet to the element thereby inducing a biasing magnetic field in the element. A high output voltage is to be obtained by using a good linear response in the magneto-resistance curve, when the amplitude of the biasing magnetic field is optimized. The spacer 17 is used to prevent an electrical short circuit between the electrodes through the biasing magnet, or is used to set a space between the element and the biasing magnet so as to optimize the amplitude of the biasing magnetic field in the van der Pauw element. In some cases, spacer 17 can be removed.

FIGS. 9(a) and (b) shows variation of the present invention shown in FIG. 8. In the configuration shown in FIG. 9(a), the embedded cylindrical high conduction material 10 is set in the center of the cylindrical high electron mobility semiconductor 11. In the configuration shown in FIG. 9(b), the embedded cylindrical high conduction material 10 is set in a position shifted from the center of the cylindrical high electron mobility semiconductor 11.

Figure 10:
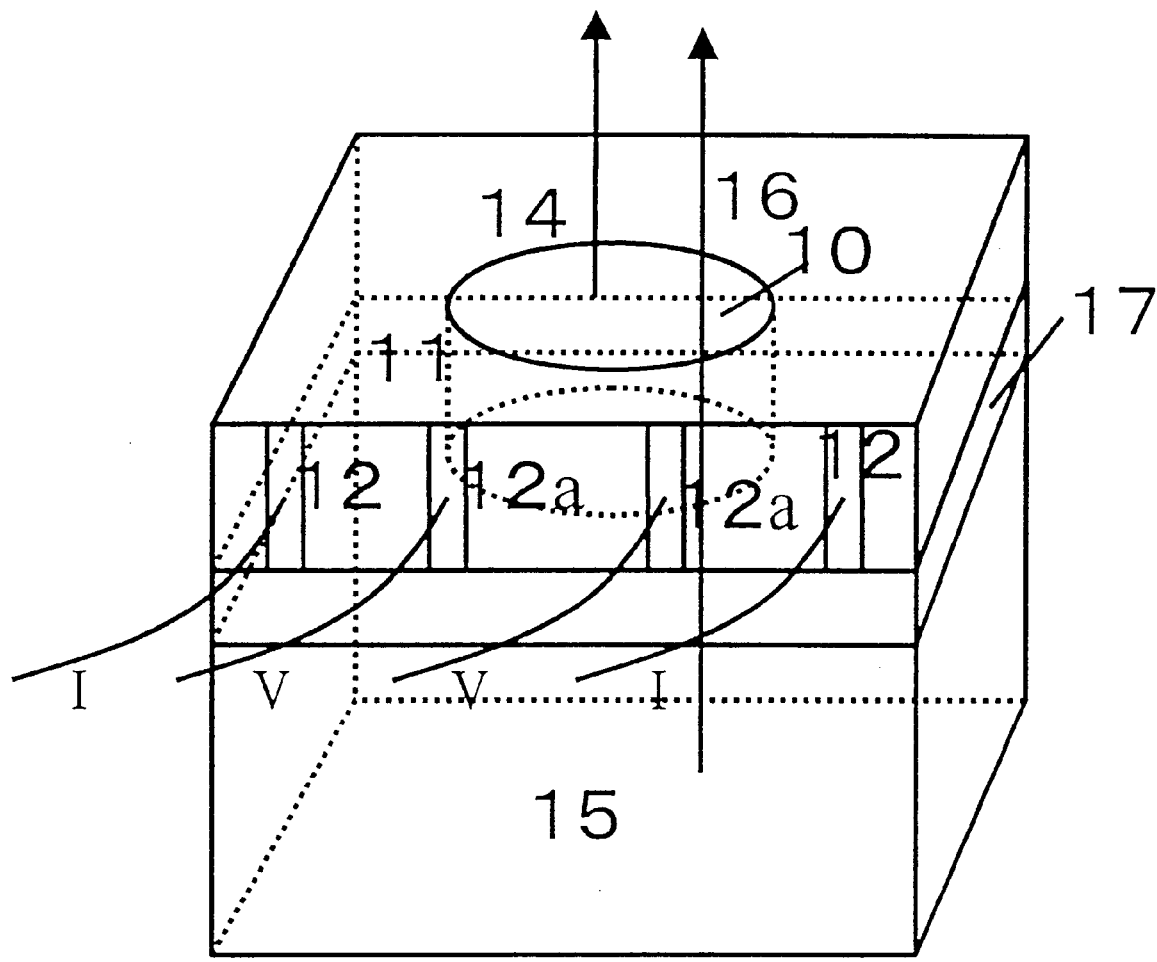
FIG. 10 shows a magnetoresistive element of the present invention.
Figure 11:
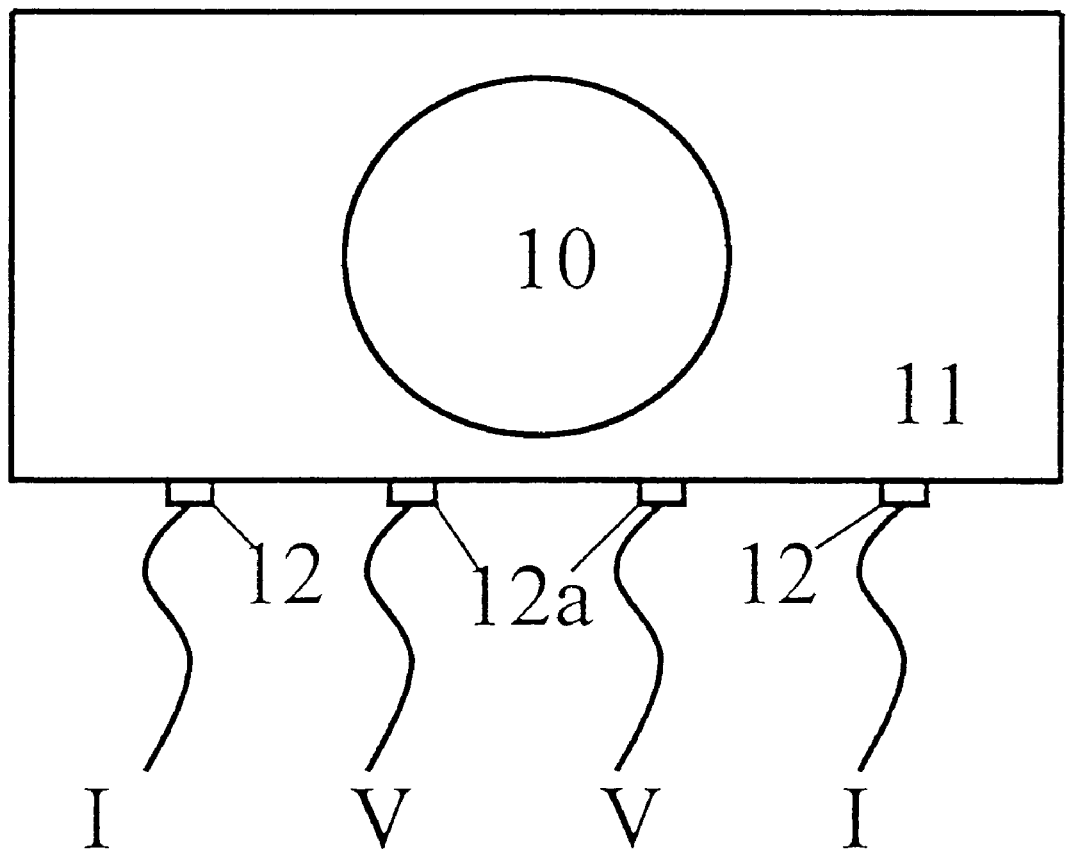
FIG. 11 is a plane view of a magnetoresistive element of the present invention.

FIG. 10 shows an embodiment of the present invention. In this case, rectangular van der Pauw element is used as a magnetoresistive element. As shown in FIG. 10, this van der Pauw element comprises a rectangular high electron mobility semiconductor 11, a high electron conduction material 10 buried in the rectangular high electron mobility semiconductor 11, a pair of electrodes 12 which make a current path in the cylindrical high electron mobility semiconductor 11 and in the high conduction material 10, and another pair of electrodes 12a to detect the induced voltage by the current. This element can detect the magnetic field 14 which direction is nearly perpendicular to the top surface of the embedded high conduction material 10. When a magnetic field in said direction is applied to the element, the voltage between the electrodes to detect the induced voltage by the current changes. A spacer 17 is set under the element and a biasing magnet is set under the spacer 17. A biasing magnetic field 16 which is parallel or nearly parallel to the direction shown in FIG. 10 is supplied from the biasing magnet to the element thereby inducing a biasing magnetic field in the element. A high output voltage is to be obtained by using a good linear response in the magneto-resistance curve, when the amplitude of the biasing magnetic field is optimized. The spacer 17 is used to prevent an electrical short circuit between the first electrodes through the biasing magnet, or is used to set a space between the element and the biasing magnet so as to optimize the amplitude of the biasing magnetic field in the van der Pauw element. In some cases, spacer 17 can be removed. FIG. 11 shows a plan view of the element shown in FIG. 10.

Figure 12A:
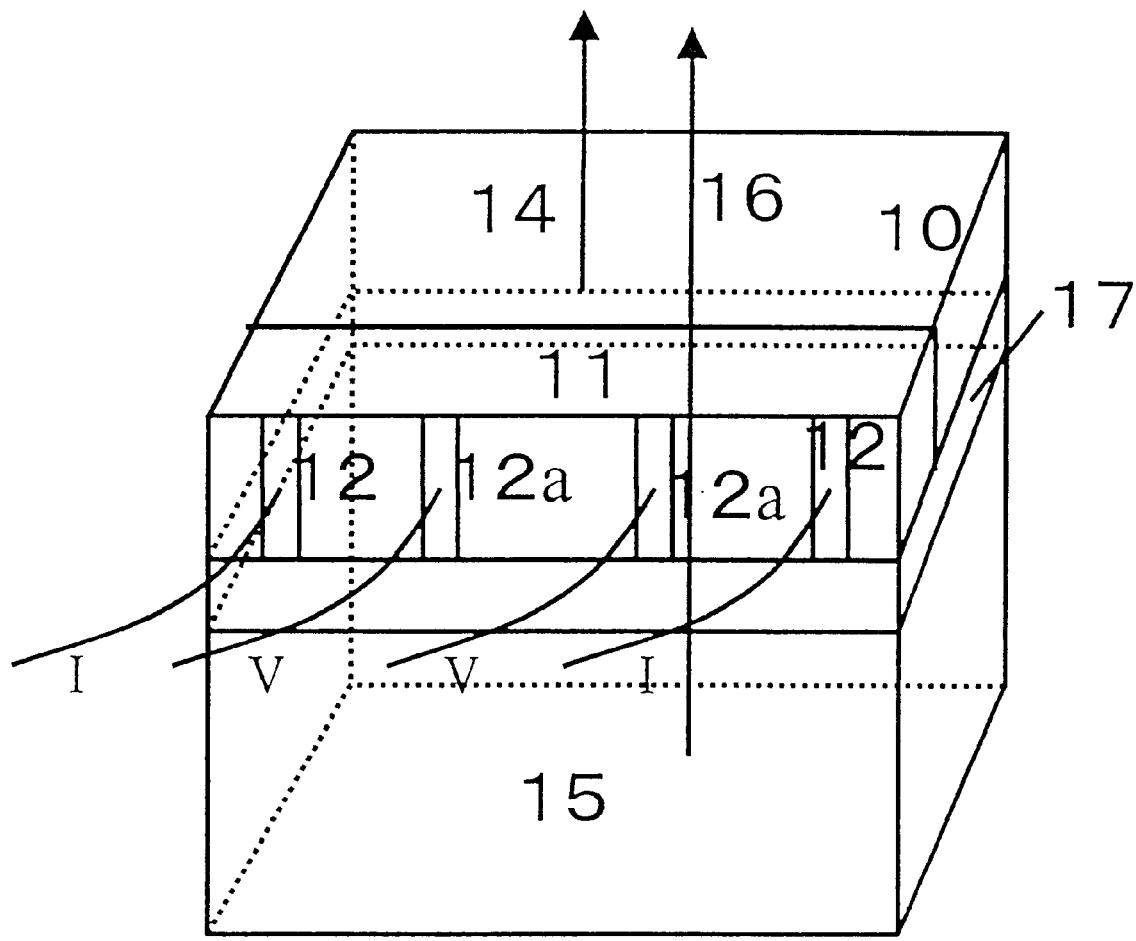
FIG. 12a shows a magnetoresistive element of the present invention.
Figure 12B:
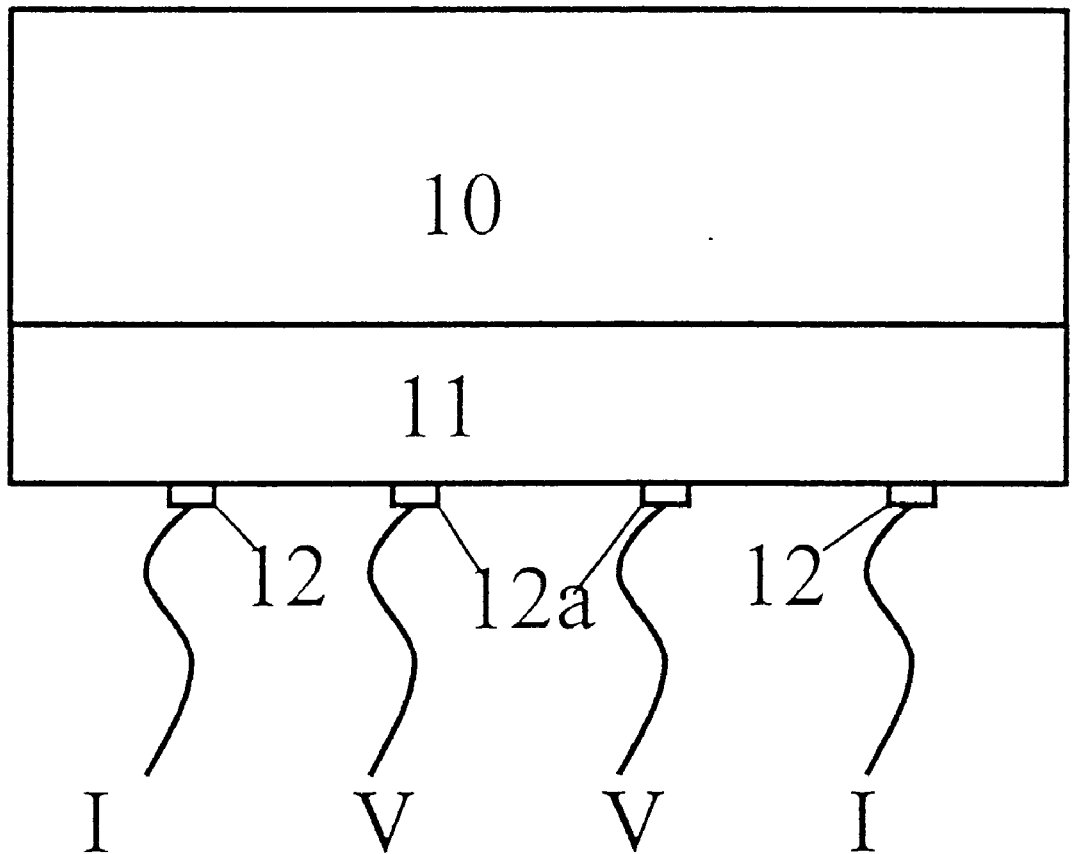
FIG. 12b is a plane view of a magnetoresistive element of the present invention.

FIG. 12a shows an embodiment of the present invention. In this case, a rectangular van der Pauw element is used as a magnetoresistive element. As shown in FIG. 12a, this van der Pauw element comprises a rectangular high electron mobility semiconductor 11, a high electron conduction material attached to the rectangular high electron mobility semiconductor 11, a pair of electrodes 12 which make a current path in the cylindrical high electron mobility semiconductor 11 and in the high conduction material 10, and another pair of electrodes 12a to detect the induced voltage by the current. This element can detect the magnetic field 14, which direction is parallel or nearly parallel to the magnetic field direction shown in FIG. 12. When a magnetic field in said direction is applied to the element, the voltage between the electrodes to detect the induced voltage by the current changes. A spacer 17 is set under the element and a biasing magnet is set under the spacer 17. A biasing magnetic field 16 which is parallel or nearly parallel to the direction shown in FIG. 12 is supplied from the biasing magnet 15 to the element thereby inducing a biasing magnetic field in the element. A high output voltage is to be obtained by using a good linear response in the Magneto-resistance curve, when the amplitude of the biasing magnetic field is optimized. The spacer 17 is used to prevent an electrical short circuit between the first electrode 1 and the second electrode 2 through the biasing magnet, or is used to set a space between the element and the biasing magnet so as to optimize the amplitude of the biasing magnetic field in the van der Pauw element. In some cases, spacer 17 can be removed. FIG. 12b is a plane figure of the element shown in FIG. 12a.

Figure 13A:
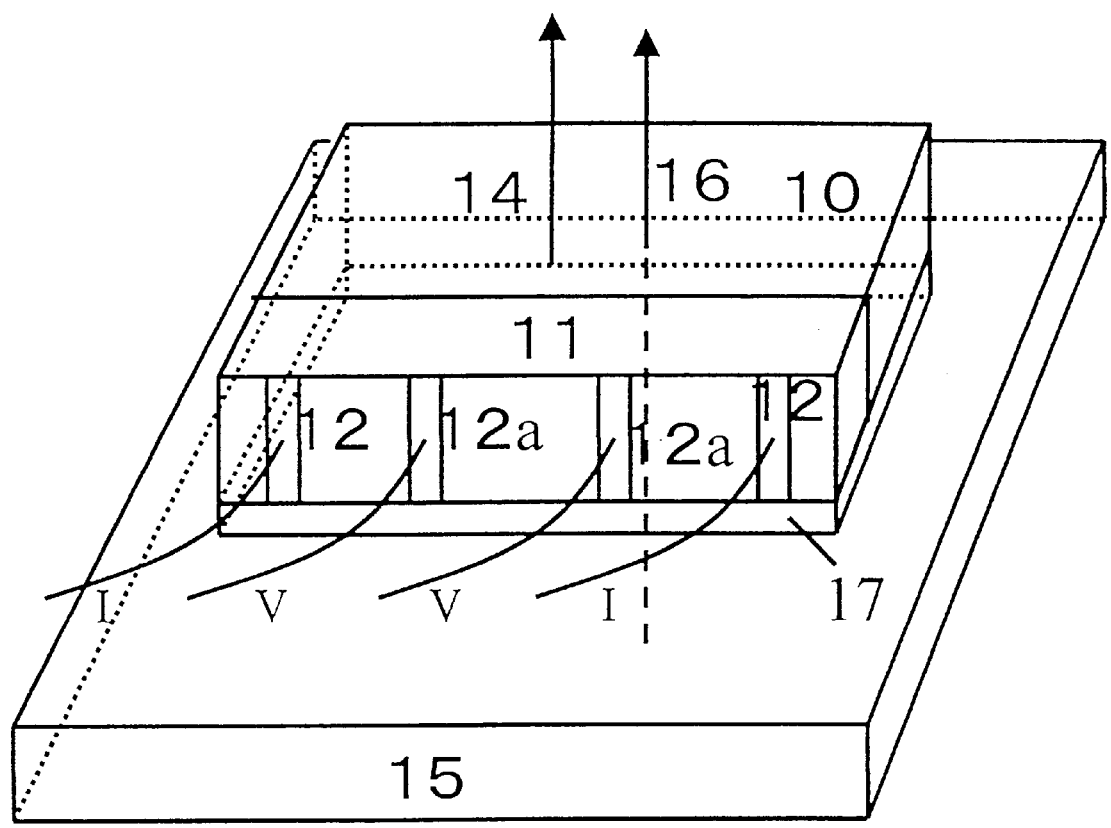
FIG. 13a shows a magnetoresistive element of the present invention.
Figure 13B:
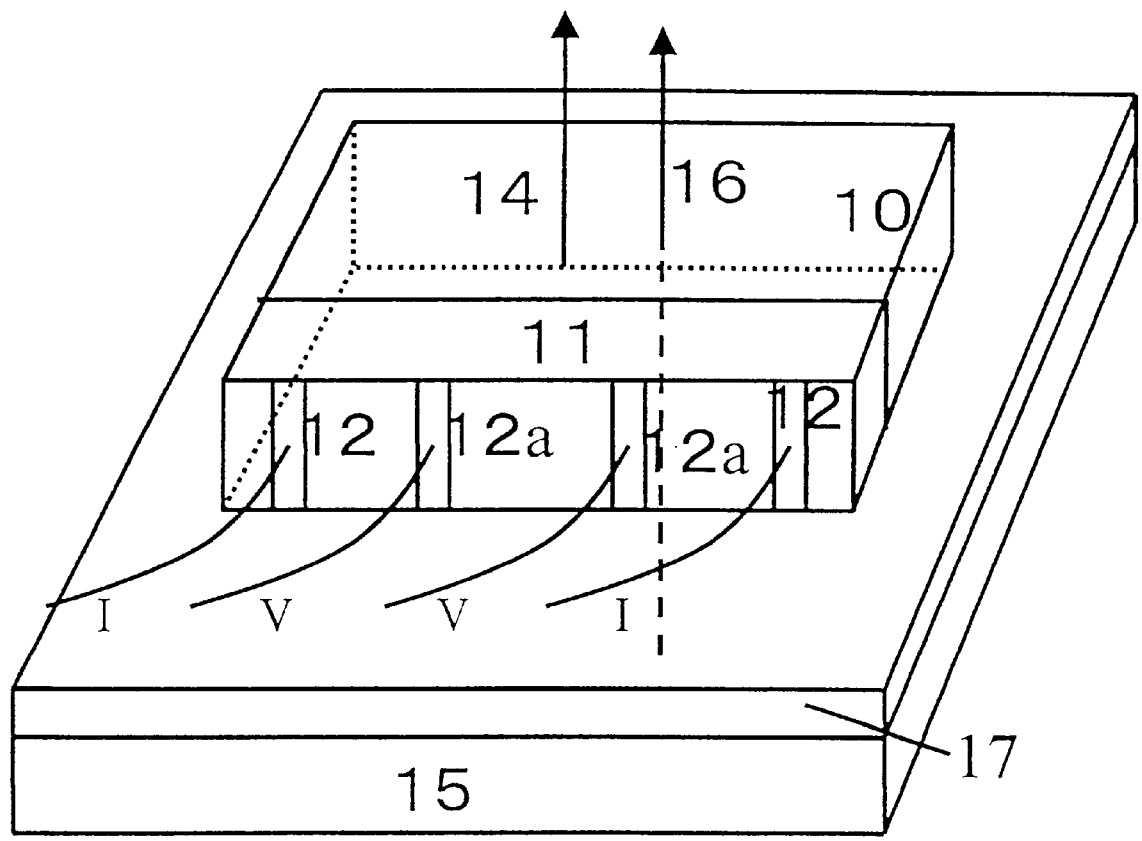
FIG. 13b shows a magnetoresistive element of the present invention.

FIG. 13a and FIG. 13b show variations of the element structure shown in FIG. 12a. FIG. 13a is the case in which the area of the biasing magnet 15 is larger than that of the pattern containing high electron mobility semiconductor 11, the high conduction material 10, and the spacer 17. FIG. 13b is the case in which the area of the biasing magnet 15 and the spacer 17 is larger than that of the pattern containing high electron mobility semiconductor 11 and the high conduction material 10.

Shielding is not necessary in the embodiments described above, however, in some applications it may by preferable to include shielding. The embodiments described below do corporate shielding.

In order to apply a magnetoresistive element to a reproducing head, it is effective to put a shield around the element in order to obtain good resolution for detecting a stray field from a recorded domain on a recording media. Examples of high electron mobility semiconductor 11 elements to which a magnetic shield was attached are shown as follows.

Figures 14A, 14B:
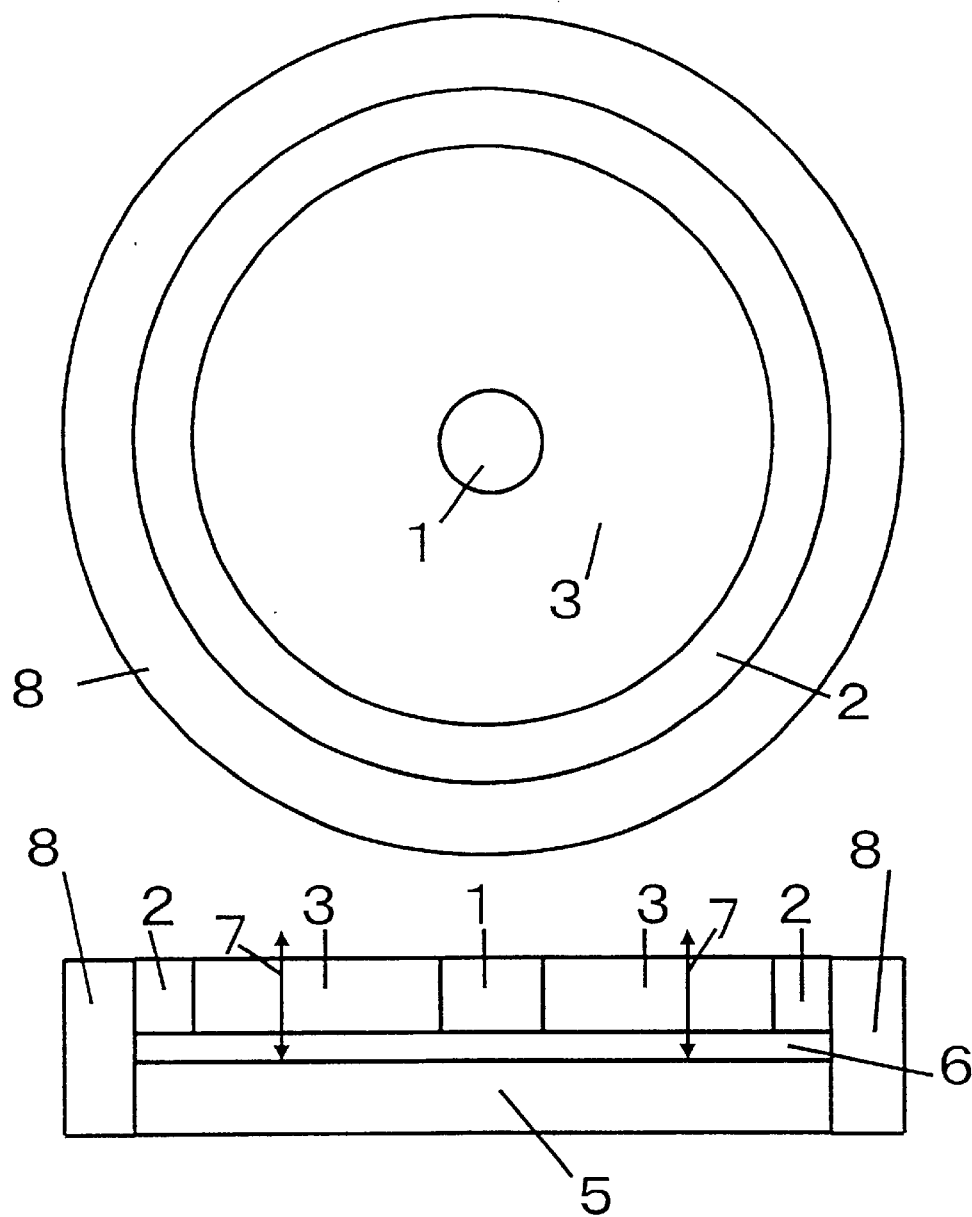
FIGS. 14a and 14b show a magnetoresistive element of the present invention.

FIGS. 14a and 14b show an embodiment of the present invention. In this case, cylindrical Corbino element shown in FIG. 4 is used as a magnetoresistive element. As shown in FIGS. 14a and 14b, a magnetic shield 8 is attached onto the surface of the second electrode 2, the spacer 6, and the biasing magnet 5. By the existence of this shield 8, only a stray field from a magnetic domain right near the element can go into the Corbino element. As a result, the reproducing resolution of the element can be improved. In FIG. 14 is shown the structure in which the second electrode 2 is in contact with the shield 8, but it is possible that a separation layer is set between the second electrode 2 and the shield 8. An additional possibility is that the second electrode 2 is in common with the shield 8. The second electrode being in common with the shield 8 means that the shield 8 is used not only as a shield, but also as a second electrode. The shield 8 has a role of both a shield and a second electrode.

Figures 1, 15:
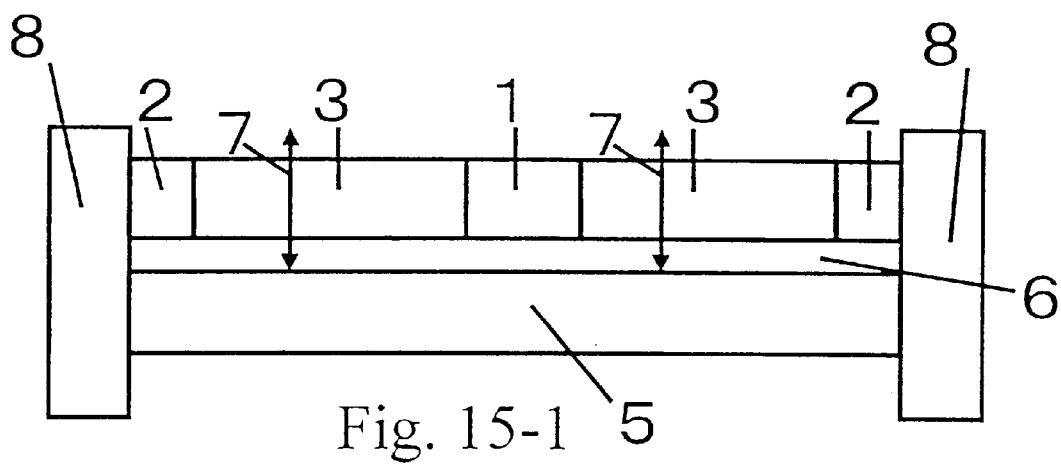
Figures 2, 15:
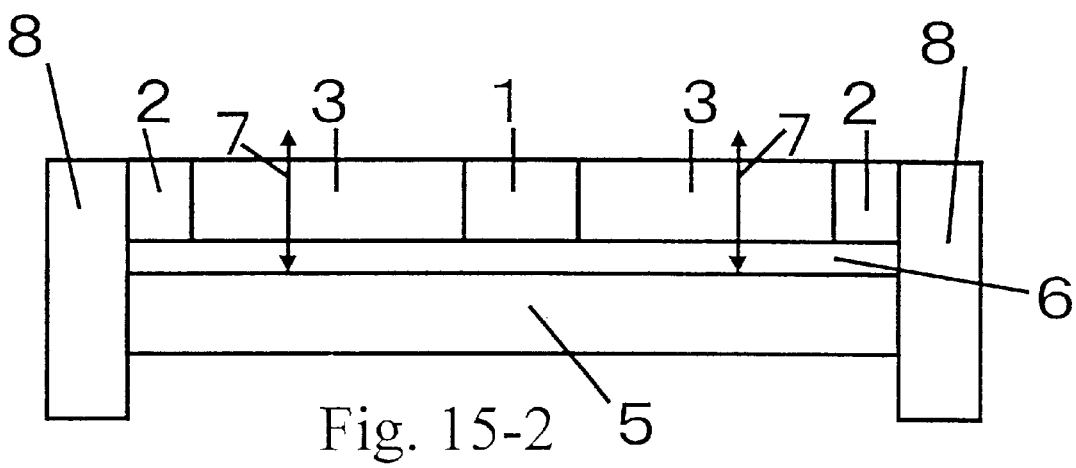
Figures 3, 15:
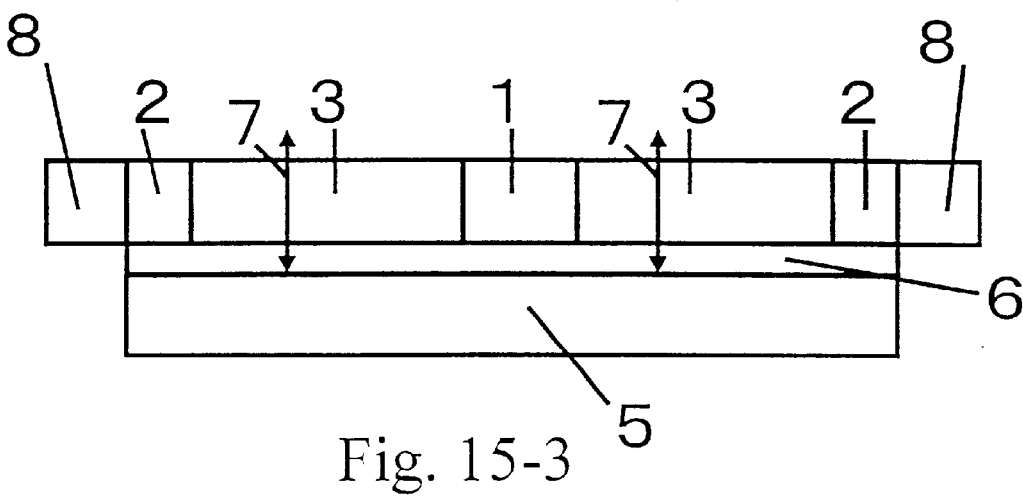
Figures 4, 15:
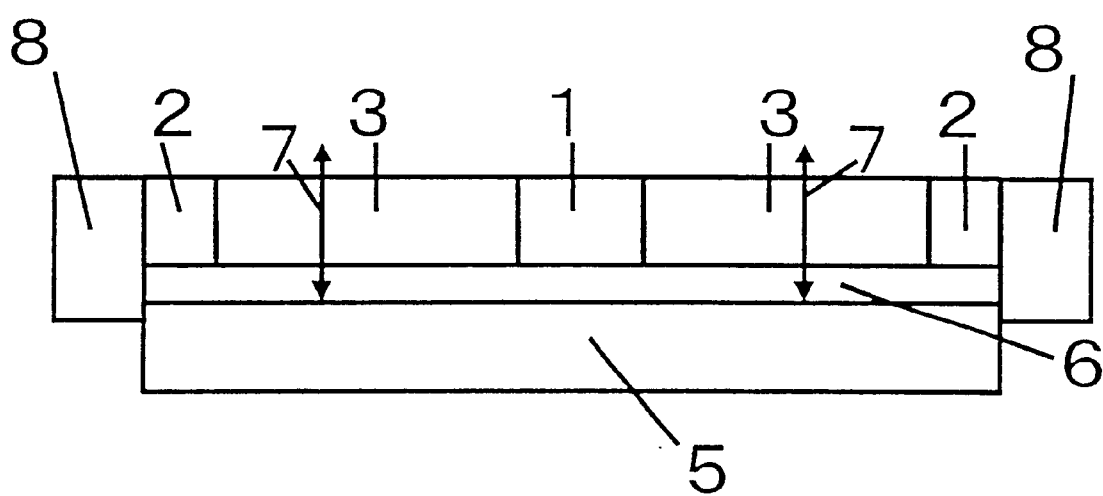

FIG. 15-1 to FIG. 15-4 show cross sectional views of the variations of the element shown in FIGS. 14a and 14b. The height of the shield 8 and the spatial relation between the shield 8 and the Corbino element can be changed as shown in FIG. 15-1 to FIG. 15-4.

Figure 16A:
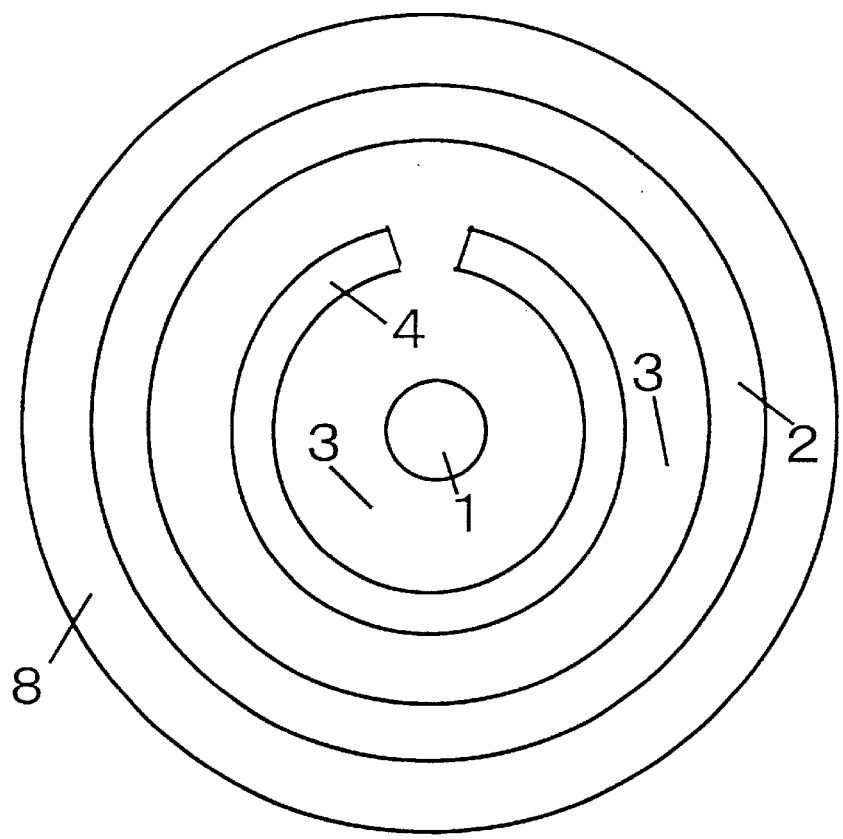
FIGS. 16a and 16b show a magnetoresistive element of the present invention.
Figure 16B:
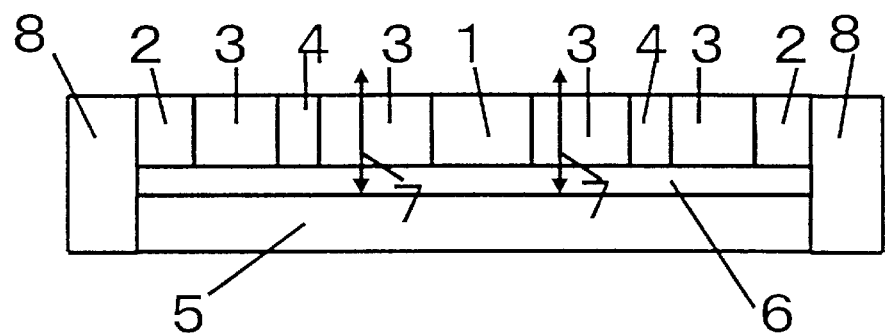

FIGS. 16a and 16b show an embodiment of the present invention. In this case, the magnetoresistive element shown in FIG. 5 is used as a magnetoresistive element. As shown in FIGS. 16a and 16b, a magnetic shield 8 is attached around the second electrode 2, the spacer 6, and the biasing magnet 5. By the existence of this shield 8, only a stray field from a magnetic domain right near the element can go into the Corbino element. As a result, the reproducing resolution of the element can be improved. In FIGS. 16a and 16b is shown the structure in which the second electrode 2 is in contact with the shield 8, but it is possible that the second electrode 2 is in common with the shield 8, or that a separation layer is set between the second electrode 2 and the shield 8.

Figures 17A, 17B:
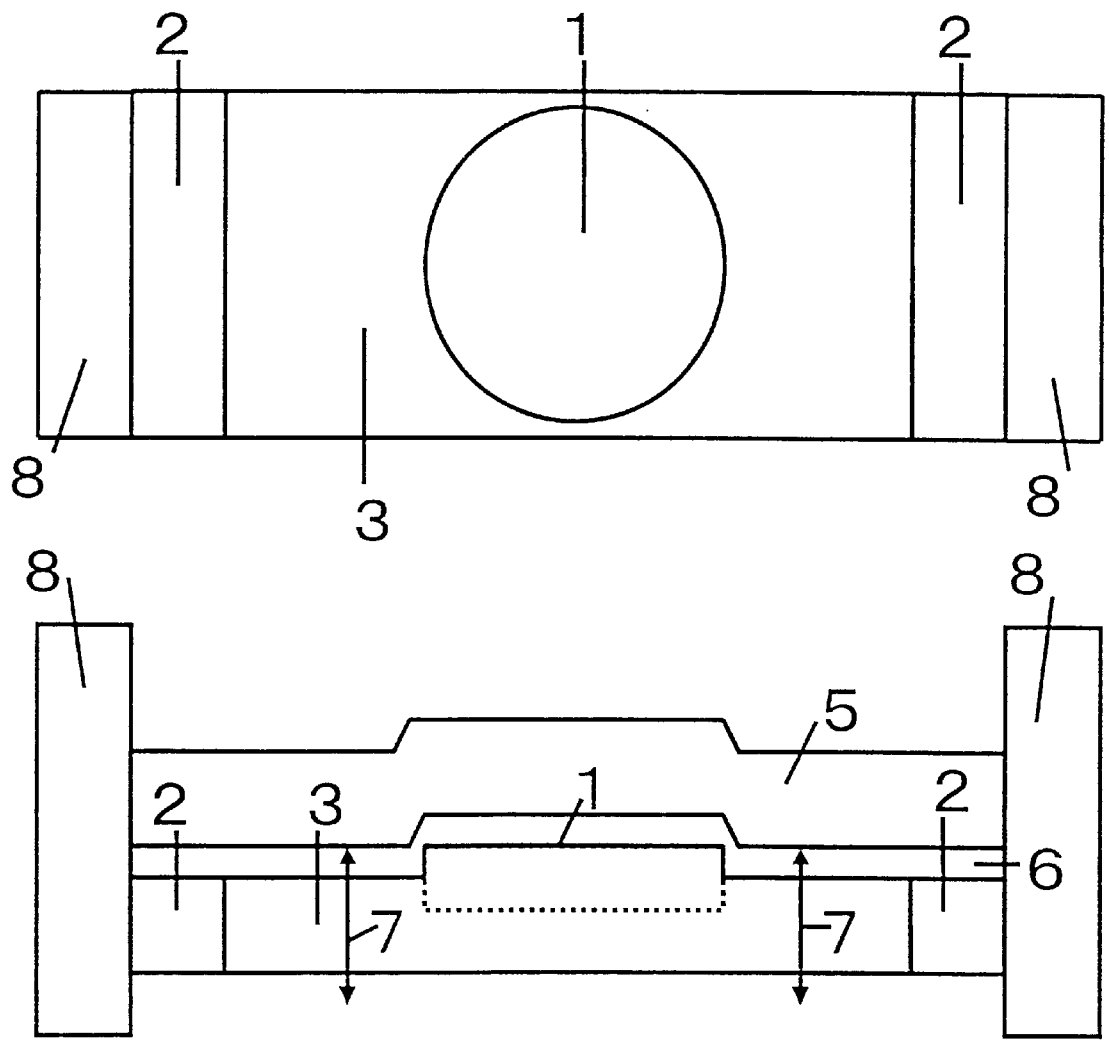
FIGS. 17a and 17b show a magnetoresistive element of the present invention.

FIGS. 17a and 17b show an embodiment of the present invention. In this case, the magnetoresistive element shown in FIG. 6 is used as a magnetoresistive element. As shown in FIGS. 17a and 17b, a magnetic shield 8 is attached around the second electrode 2, the spacer 6, and the biasing magnet 5. By the existence of this shield 8, only a stray field from a magnetic domain right near the element can go into the Corbino element. As a result, the reproducing resolution of the element can be improved. In FIGS. 17a and 17b is shown the structure in which the second electrode 2 is in contact with the shield 8, but it is possible that the second electrode 2 is in common with the shield 8, or that a separation layer is set between the electrode 2 and the shield 8.

FIGS. 18a and 18b show an embodiment of the present invention. In this case, the magnetoresistive element shown in FIG. 6 is used as a magnetoresistive element. As shown in FIGS. 18a and 18b, a magnetic shield 8 is attached around the second electrode 2, the spacer 6, and the biasing magnet 5. By the existence of this shield 8, only a stray field from a magnetic domain right near the element can go into the Corbino element. As a result, the reproducing resolution of the element can be improved. In FIGS. 18a and 18b is shown the structure in which the second electrode 2 is in contact with the element, but there is a possibility that a separation layer is set between the second electrode 2 and the shield 8.

FIGS. 19a and 19b show an embodiment of the present invention. In this case, the element shown in FIG. 7 is used as a magnetoresistive element. As shown in FIGS. 19a and 19b, a magnetic shield 8 is attached to the second electrode 2, the spacer 6, and the biasing magnet 5. By the existence of this shield 8, only a stray field from a magnetic domain right near the element can go into the Corbino element. As a result, the reproducing resolution of the element can be improved. In FIGS. 19a and 19b is shown the structure in which the second electrode 2 is in contact with the element, but it is possible that the second electrode 2 is in common with the shield 8, or that a separation layer is set between the second electrode 2 and the shield 8.

FIGS. 20a and 20b show an embodiment of the present invention. In this case, the magnetoresistive element shown in FIG. 7 is used as a magnetoresistive element. As shown in FIGS. 20a and 20b, a magnetic shield 8 is attached onto the surface of the second electrode 2, the spacer 6, and the biasing magnet 5. By the existence of this shield 8, only a stray field from a magnetic domain right near the element can go into the Corbino element. As a result, the reproducing resolution of the element can be improved. In FIGS. 20a and 20b is shown the structure in which the second electrode 2 is in contact with the element, but it is possible that the second electrode 2 is in common with the shield 8, or that a separation layer is set between the second electrode 2 and the shield 8.

Figure 21:
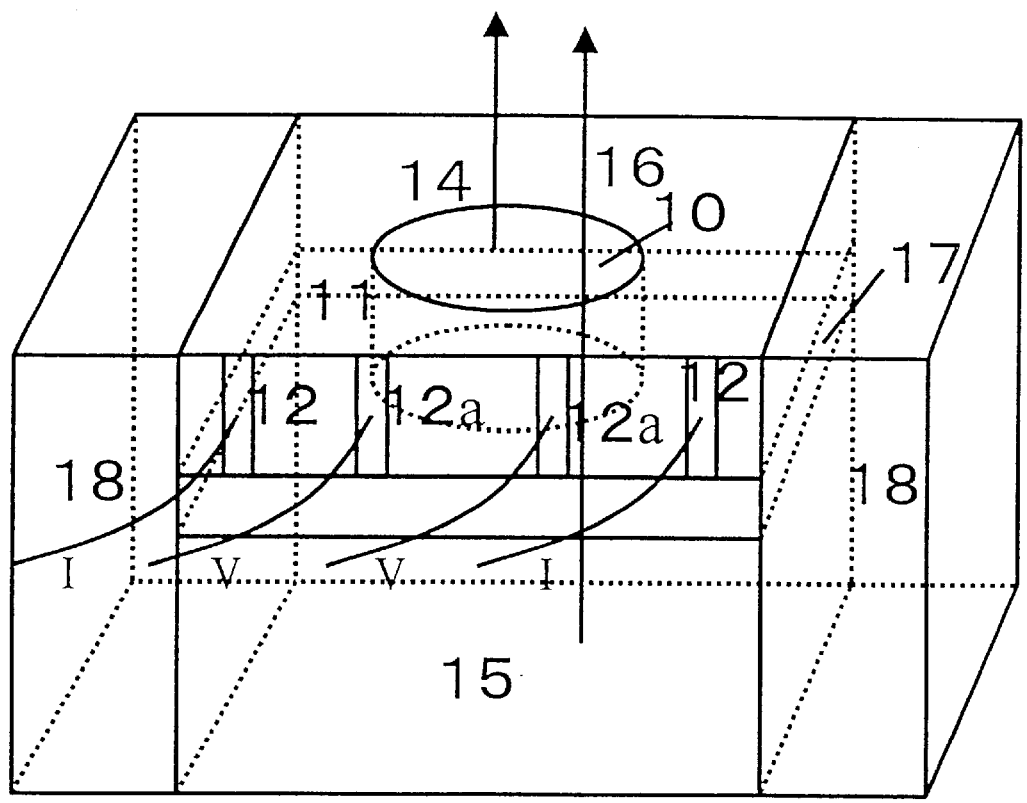
FIG. 21 shows a magnetoresistive element of the present invention.

FIG. 21 shows an embodiment of the present invention. In this case, the magnetoresistive element shown in FIG. 10 is used as a magnetoresistive element. As shown in FIG. 21, a magnetic shield 18 is attached onto the surface of the high mobility semiconductor 11, the spacer 17, and the biasing magnet 16. By the existence of this shield 18, only a stray field from a magnetic domain right near the element can go into the element. As a result, the reproducing resolution of the element can be improved. In FIG. 21 is shown the structure in which the shield 18 is in contact with the element, but it is possible that a separation layer is set between the element and the shield 18.

Figure 22:
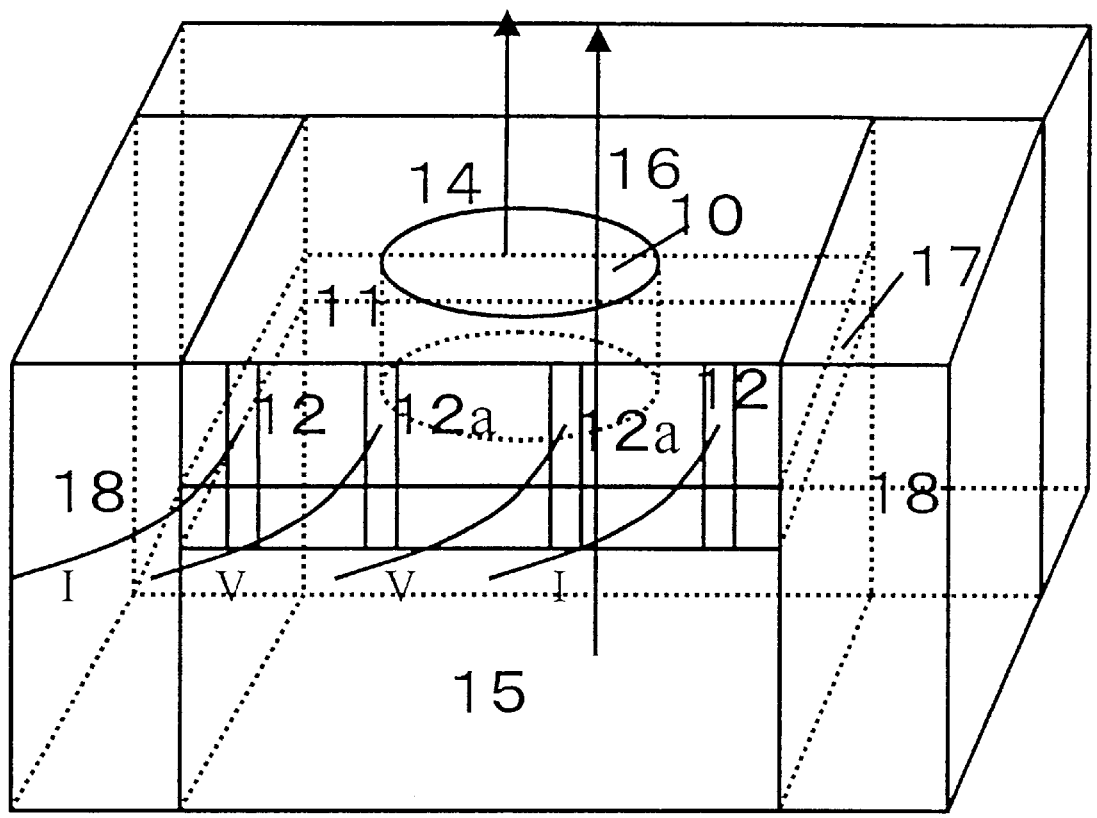
FIG. 22 shows a magnetoresistive element of the present invention.

FIG. 22 shows an embodiment of the present invention. In this case, the magnetoresistive element shown in FIG. 10 is used as a magnetoresistive element. As shown in FIG. 21, a magnetic shield is attached onto the surface of the high mobility semiconductor 11, the spacer 17, and the biasing magnet 16. By the existence of this shield 18, only a stray field from a magnetic domain right near the element can go into the element. As a result, the reproducing resolution of the element can be improved. In FIG. 22 is shown the structure in which the shield 18 is in contact with the element, but it is possible that a separation layer is set between the element and the shield 18.

Figures 1, 23:
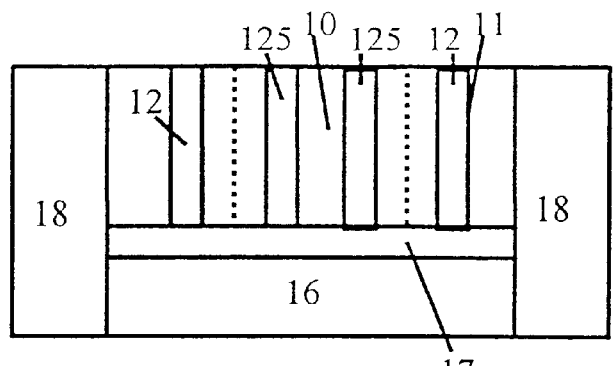
Figures 2, 23:
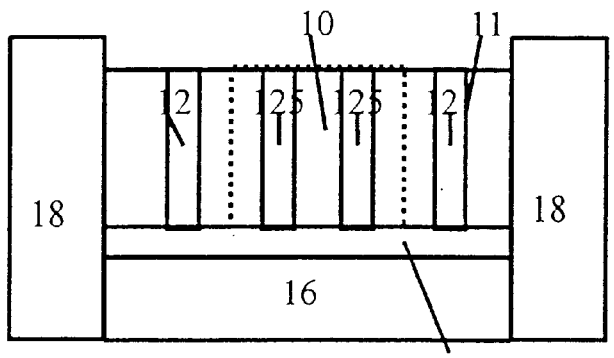
Figures 3, 23:
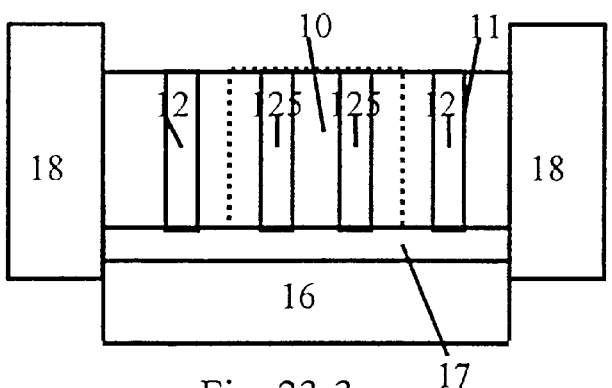
Figures 4, 23:
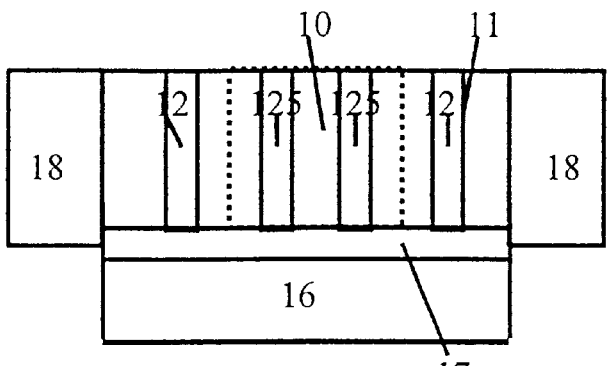

FIG. 23-1 to FIG. 23-4 show side elevation views of the element shown in FIG. 22. The height of the shield and the spatial relation between the shield 18 and the magnetoresistive element can be changed as shown in FIG. 23-1 to FIG. 23-4.

Here, an explanation will be given of the detailed configuration, a representative production procedure, and a recording/reproducing head. Firstly, the components will be detailed. For example, it is preferable to use the following materials for the respective layers.

Figure 2:
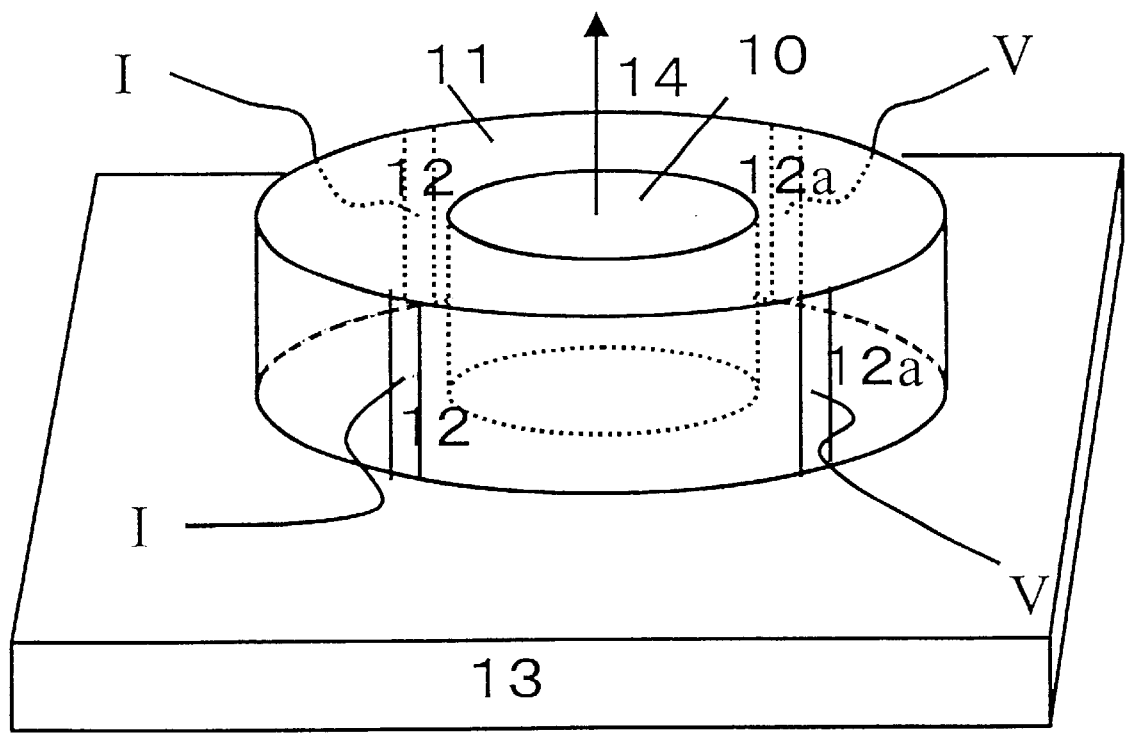
FIG. 2 shows a conventional high electron mobility semiconductor magnetoresistive element of the prior art.

The substrate is preferably formed from the altic (alumina-titanium-carbide) SiC, alumina, altic/alumina, or Sic/alumina. The substrate is not shown in any of FIGS. 4-23 but as shown in FIG. 2, the magnetoresistive element is mounted on a substrate.

The shield layer is preferably formed from NiFe, NiFeCo, CoZr, CoFeB, CoZrMo, CoZrNb, CoZr, CoZrTa, CoHf, CoTa, CoTaHf, CoNbHf, CoHfPd, CoTaZrNb, CoZrMoNe alloy, FeAlSi, iron nitride, MnZn ferrite, NiZn ferrite, MgZn ferrite as a single layered film or multi-layered film or film made from a mixture of these materials.

The electrodes (a first electrode 1, a second electrode 2, a pair of electrodes for current supply, or a pair of electrodes for detection of voltage) are preferably made from Si, GaAs, InAs, InAsSb, Au, Ag, Cu, Mo, W, Y, Ti, Zr, Hf, V, Nb, Pt, or Ta as a single layered film or multilayered film or a film made from a mixture of these materials. When an electrode is in common with a shield, said materials for the shield layer are used as materials for the electrodes.

The high conduction materials are preferably made from Si, GaAs, InAs, InAsSb, Au, Ag, Cu, Mo, W, Y, Ti, Zr, Hf, V, Nb, Pt, or Ta as a single layered material or multi-layered material made from a mixture of these materials.

The high electron mobility semiconductor is made from Si, GaAs, HgCd, HgCdTe, InSb, InSbTe, InAs, InAsSb as a single layered material or a multi-layered material or a material from a mixture made of these materials.

The spacers are made from Al-oxide, Si-oxide, Al-nitride, Si-nitride, diamond like carbon as a single layered material or multi-layered material or a material made from a mixture of these materials.

The separation layers are made from Al-oxide, Si-oxide, Al-nitride, Si-nitride, diamond like carbon as a single layered material or multi-layered material or a material made from a mixture of these materials.

The burying layers are made from Al-oxide, Si-oxide, Al-nitride, Si-nitride, diamond like carbon as a single layered material or multi-layered or a material made from a mixture of these materials.

The biasing magnet are made from CoCrPt, CoCr, CoPt, CoCrTa, CoCrPtTa, SmCo, Co based ferrite, Ba based ferrite as a single layered material or multi-layered material or a material made from a mixture of these materials.

Figure 24:
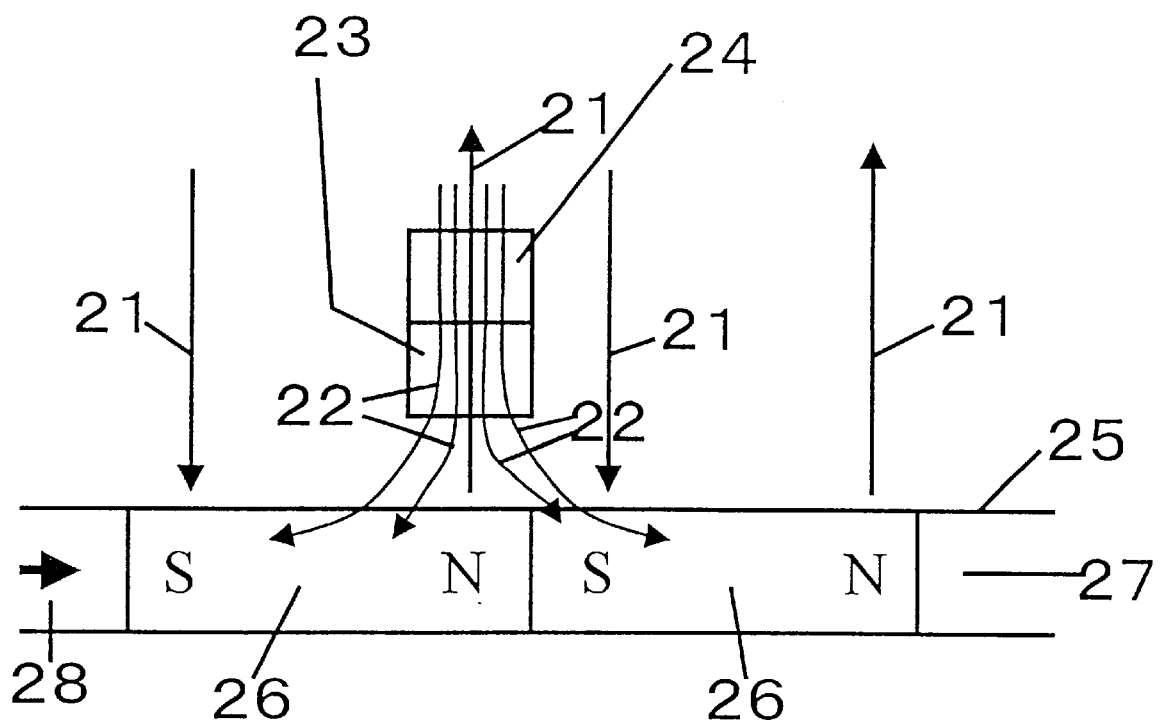
FIG. 24 shows a reproducing mechanism when the magnetoresistive element of the present invention detects a stray field from the longitudinally recorded magnetic domain bit on a recording medium.

FIG. 24 shows a reproducing mechanism when the magnetoresistive element of present invention detects a stray field from the longitudinally recorded magnetic domain bit on a recording medium. In the medium 27, the magnetization direction in the recorded domain is parallel, nearly parallel, anti-parallel or nearly anti- parallel to the moving direction 28 of the media. A stray field 21 comes out from a magnetic pole in the recorded domain 26 and is brought into the high electron mobility semiconductor magnetoresistive element 23. A biasing magnet 24 is attached to the element side which is not opposed to the medium surface 25 and supplies a biasing magnetic field 22 to the element. The field in the element is the sum of the stray field 21 from the magnetic pole of the domain 26 and a biasing magnetic field 22. The stray field 21 from the magnetic domain 26 becomes positive or negative in accordance with whether the pole just below the element 23 is N pole or S pole when the medium 27 moves. The sum of a fixed biasing magnetic field 22 and an alternating stray field 21 changes when the medium 27 moves. When the biasing magnetic field 22 is optimized to the value at which the element resistance changes linearly and largely according to the stray field change, a large output signal can be obtained.

On the other hand, a biasing magnetic field 22 reaches not only the to element 23 but also to the medium surface 25. When the amplitude of the biasing magnetic field 22 at the medium surface 25 is larger that the critical amplitude of the magnetic field where a magnetic wall of a prerecorded domain 26 starts to move, the prerecorded domain shape is distorted and the datum in the medium is destroyed.

Figure 25:
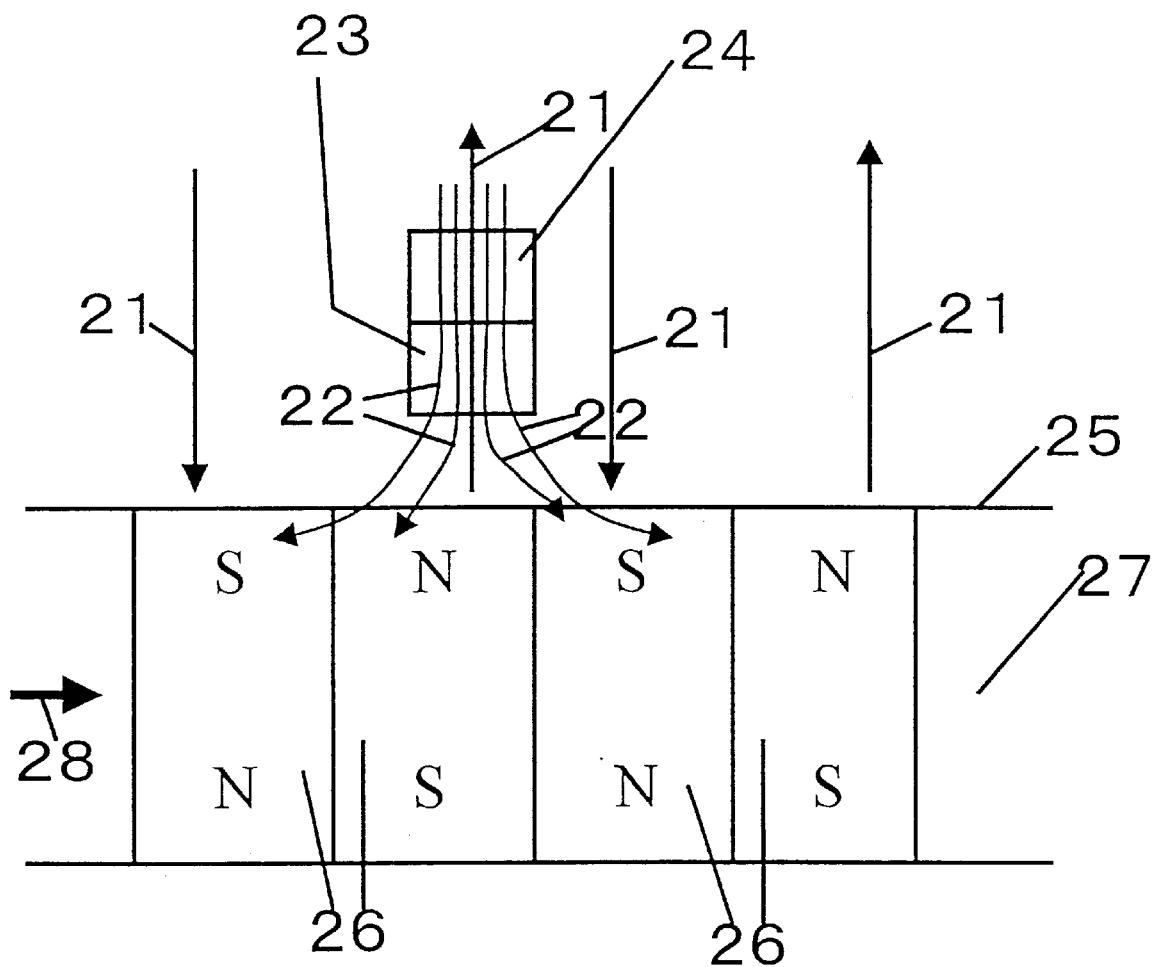
FIG. 25 shows a reproducing mechanism when the magnetoresistive element of the present invention detects a stray field from the longitudinally recorded magnetic domain bit on a recording medium.

FIG. 25 shows a reproducing mechanism when the magnetoresistive element of the present invention detects a stray field from the perpendicularly recorded magnetic domain bit on a recording medium 27. In the medium 27, the magnetization direction in the recorded domain 26 is perpendicular or nearly perpendicular to the media surface 25. A stray field 21 comes out from a magnetic pole in the recorded domain 26 and is brought into the high electron mobility semiconductor magnetoresistive element 23. On the other hand, a biasing magnet 24 is attached to the element side which is not opposed to the medium surface 25 and supplies a biasing magnetic field 22 to the element 23. The field in the element 23 is the sum of the stray field 21 from the magnetic pole of the domain and a biasing magnetic field 22. The stray field 21 from the domain 26 becomes positive or negative in value in accordance with the pole just below the element 23 being a N pole or S pole when the medium 27 moves. The sum of a fixed biasing magnetic field 22 and an alternating stray field 21 changes when the medium moves. When the biasing magnetic field 22 is optimized to the value at which the element resistance changes linearly and largely according to the stray field change, a large output signal can be obtained.

On the other hand, the biasing magnetic field 22 reaches to the medium surface 25. When the amplitude of the biasing magnetic field 22 at the media surface 25 is larger than the critical amplitude of the magnetic field where a magnetic wall of a prerecorded domain starts to move, the prerecorded domain shape is distorted and the datum in the medium is destroyed.

Next, we show a typical procedure of fabricating a head using high electron mobility semiconductor element. The high electron mobility semiconductor element used in the head is that shown in FIG. 12.

Figure 3:
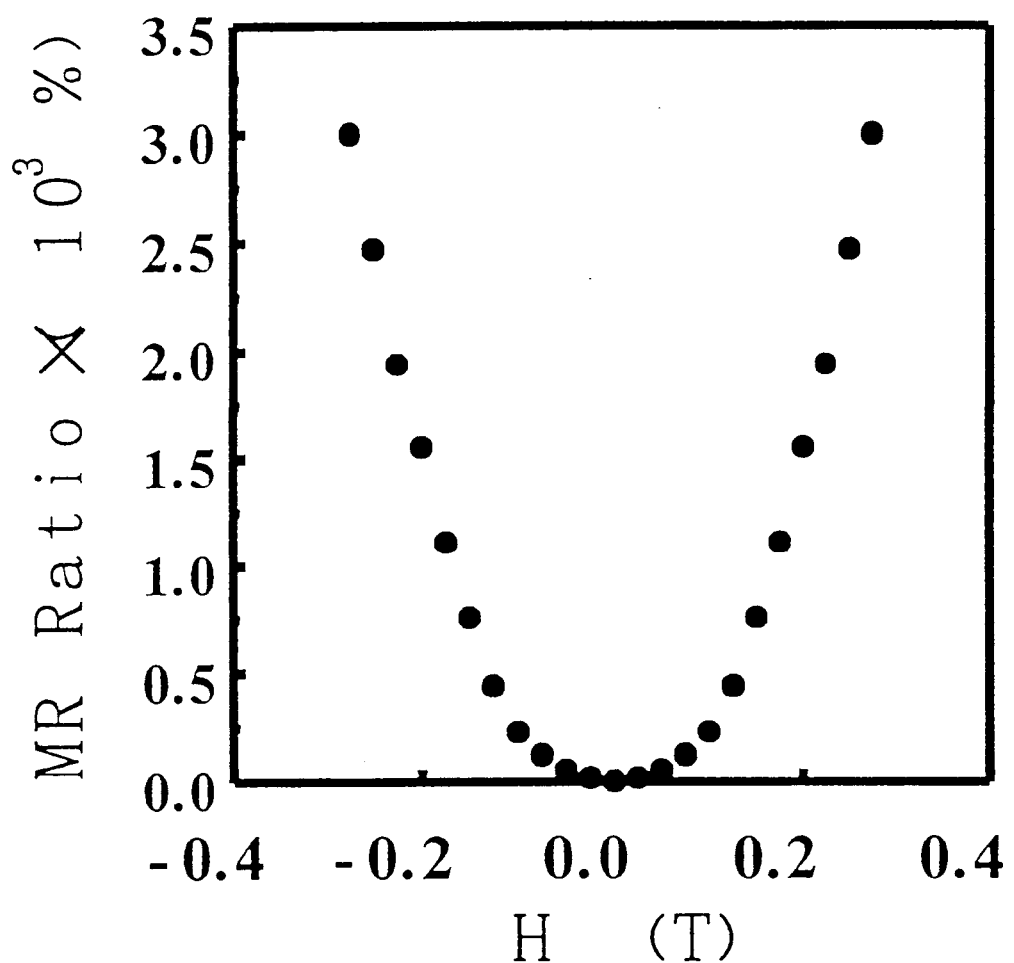
FIG. 3 shows a typical relation between resistance and an applied field in a high electron mobility semiconductor magnetoresistive element of the prior art.

1, A substrate 30 is prepared as shown in FIG. 26-1.
2, A biasing magnet layer 37 is deposited onto the substrate 30 as shown in FIG. 26-2.
3, A spacer 36 is deposited, and the spacer 36 and the biasing magnet layer are patterned as shown in FIG. 26-3.
4, A high electron mobility semiconductor layer is deposited and patterned as shown in FIG. 26-4.
5, A high conduction material 44 is sputtered and patterned as shown in FIG. 26-5.
6, High conduction material is sputtered and patterned to form two electrodes for current path 45 and two electrodes for voltage detection 46.

Next, we show another typical procedure of fabricating a head using high electron mobility semiconductor element. The high electron mobility semiconductor element used in the head is that shown in FIG. 19, where the second electrode 2 is in common with the shield.

Figure 9:
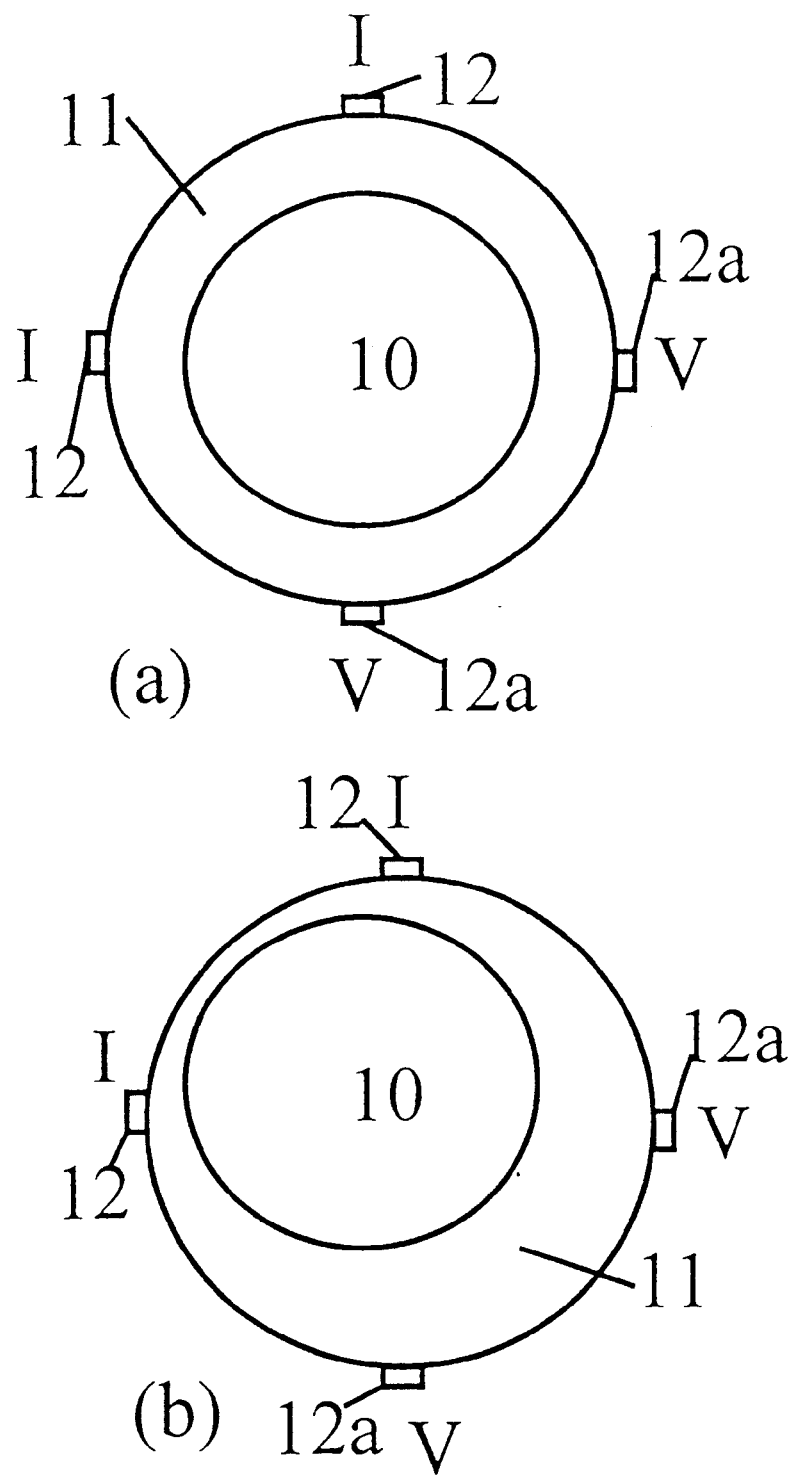
Figures 1, 27:
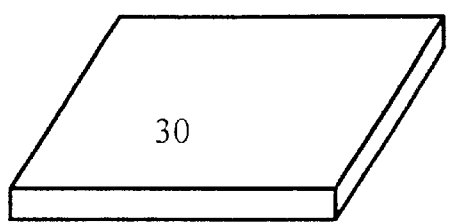
Figures 2, 27:
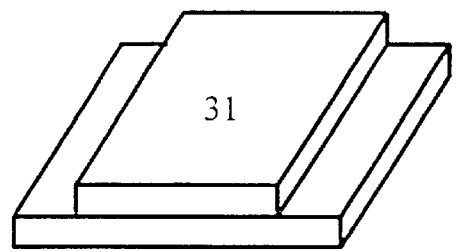
Figures 3, 27:
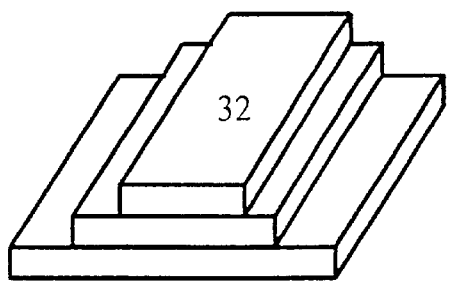
Figures 4, 27:
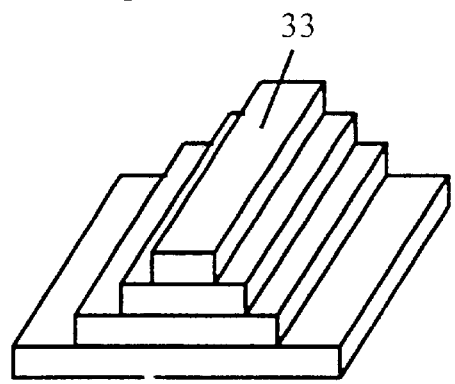
Figures 5, 27:
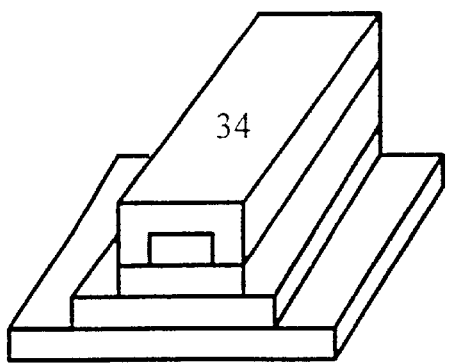
Figures 6, 27:
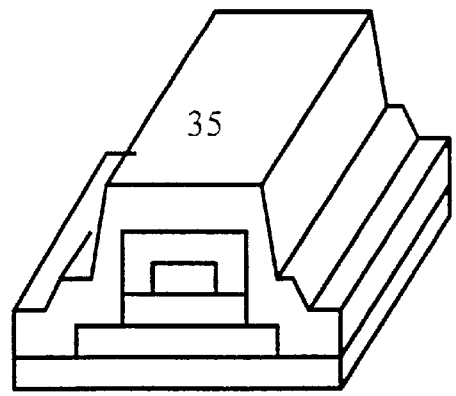
Figures 7, 27:
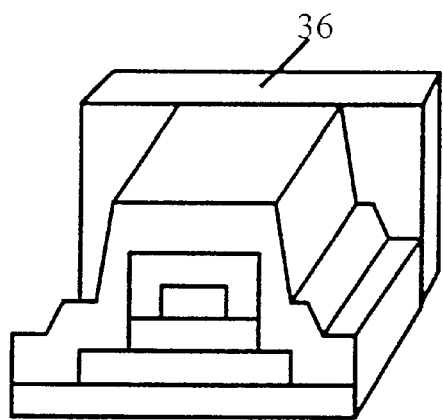
Figures 8, 27:
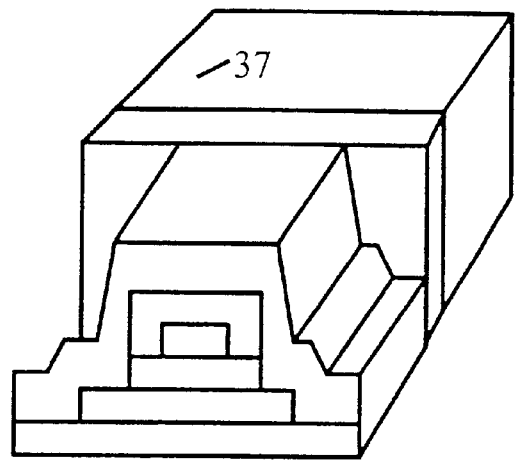
Figures 9, 27:
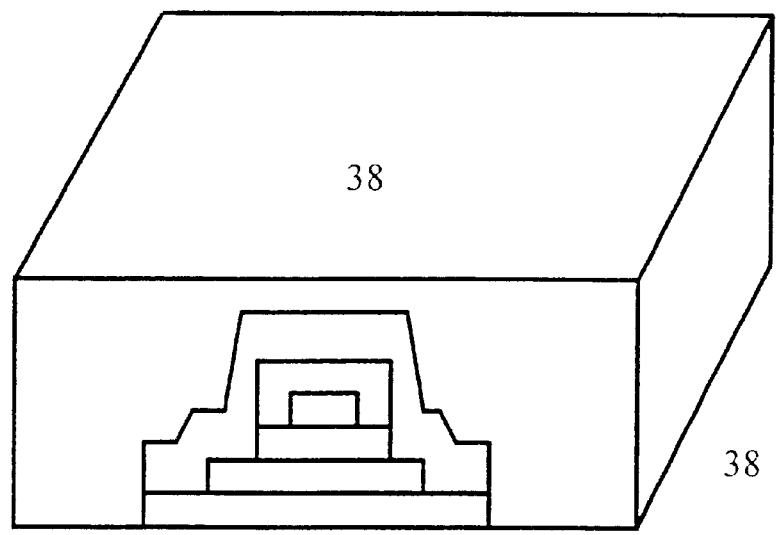
Figures 10, 27:
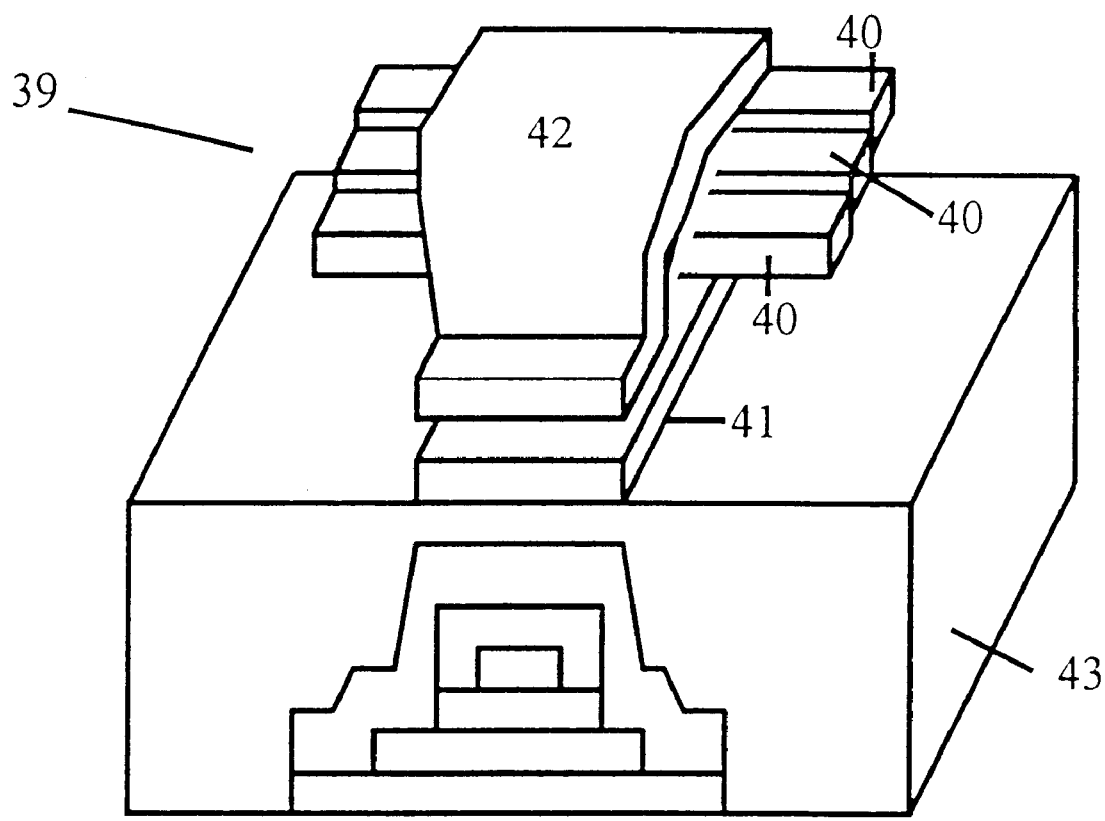

1, A substrate 30 is prepared as shown in FIG. 27-1.
2, A shield which is in common with a second electrode 31 is deposited, and patterned by using a photo lithography method as shown in FIG. 27-2.
3, A high electron mobility semiconductor 32 is deposited and patterned as shown in FIG. 27-3.
4, A first electrode 33 is deposited and patterned as shown in FIG. 27-4.
5, A high electron mobility semiconductor 34 is deposited and patterned as shown in FIG. 27-5.
6, A shield 35 which is in common with a second electrode 31 is deposited and patterned as shown in FIG. 27-6.
7, A separation layer 36 is formed and patterned as shown in FIG. 27-7.
8, A biasing magnet 37 is formed and patterned as shown in FIG. 27-8.
9, The element is buried by the burying layer 38 a shown in FIG. 27-9. The top surface of the buried element is flattened by using, for example, a chemical polishing method.
10, A write head 39, which comprises a lower pole 41, coils 40, and an upper pole 42 is fabricated onto the reproducing head 43, to form a recording/reproducing combination head as shown in FIG. 27-10.

A typical resistance change by changing the applied magnetic field is like that shown in FIG. 3 as mentioned above. As can be seen in FIG. 3, the amplitude of the magnetic field where the resistance linearly changes by varying the field is at least more than 1 koe or preferably over 1.5 kOe. Therefore, it is adequate that the amplitude of the biasing magnetic field in the element should be over 1 kOe or preferably over 2 kOe. Here, one assumes to use a biasing magnet which can generate 3 kOe biasing magnetic field in the high electron mobility semiconductor 3 element.

When one prepares CoCrPtTr perpendicular magnetization film as a biasing magnet, one can obtain over 3 kOe biasing magnetic field perpendicularly to the film surface. Recommended deposition method is sputtering. The amplitude of the biasing magnetic field varies by changing the composition of the sputtering target and by changing the sputtering condition. For example, a base pressure in the sputtering system, a sputtering power, and a substrate temperature while depositing, strongly affect the amplitude of biasing magnetic field. A thickness of film also affects the amplitude of biasing magnetic field. A suited thickness range is 20–400 nm.

We obtained a Br (residual magnetization) of 5 kG for a CoCrPtTr perpendicularly magnetized film sputtered with using a Co71Cr18Pt9Ta2 (at%) target, when the base pressure was $1*10^{-8}$ Torr and substrate temperature during deposition was 250 degree C. This film have a potential for producing biasing magnetic field of over 4 kOe.

Besides CoCr based materials, a ordered PtFe film has a potential of producing over 10 koe biasing magnetic field perpendicularly to a film surface, because its Br is reported to be around 14 koe.

A lower biasing magnetic field can easily be obtained by changing materials for the biasing magnet, changing the method for deposition, or increasing the spacing between a biasing magnet and an element including high electron mobility semiconductor.

A biasing magnetic field of over 4 kOe, which direction is parallel to the film surface can be obtained with using the material used for the longitudinal media for magnetic recording, such as CoCrTa based materials or CoCrPt based materials.

Now, we consider the case that the amplitude of biasing magnetic field applied to the element is set to 3 kOe. If one assumes 0.03 mm magnetic spacing between head and recording media, the amplitude of the biasing magnetic field on the medium surface is 2.1 kOe. Therefore, the magnetic property of the medium has to be selected so that the critical magnetic field where the magnetic wall in the prerecorded magnetic domain bit starts to move is not exceeded. In order to do that, it is preferable to set the coercive force of the media to over 3 kOe. However, in an actual recording/reproducing system, there is fluctuation of flying height and it causes the fluctuation of the amplitude of the biasing magnetic field on the medium surface, and there is also a distribution of coercive force in the medium. Therefore, the average coercive force of the medium is preferably over 5 kOe. This coercive force can be obtained when we use a material based on CoCrPt.

On the other hand, in order to record on a medium for which the coercive force is 5 kOe, a write head must generate over 5 kOe recording field. In order to secure sufficient overwrite property,. it is preferable for the write head to generate over a 8 kOe recording field. It is useful to use a magnetic material for which the saturation magnetization is over 1.8 T, as a part of the write pole near the write gap in the recording head. A NiFeCo alloy is a representative material which can generate over 1.8 T amplitude of saturation magnetization and simultaneously can have a good soft magnetic property for a recording head application. A NiFeCo alloy is a first candidate for the high saturation magnetization material for this invention.

Figure 28:
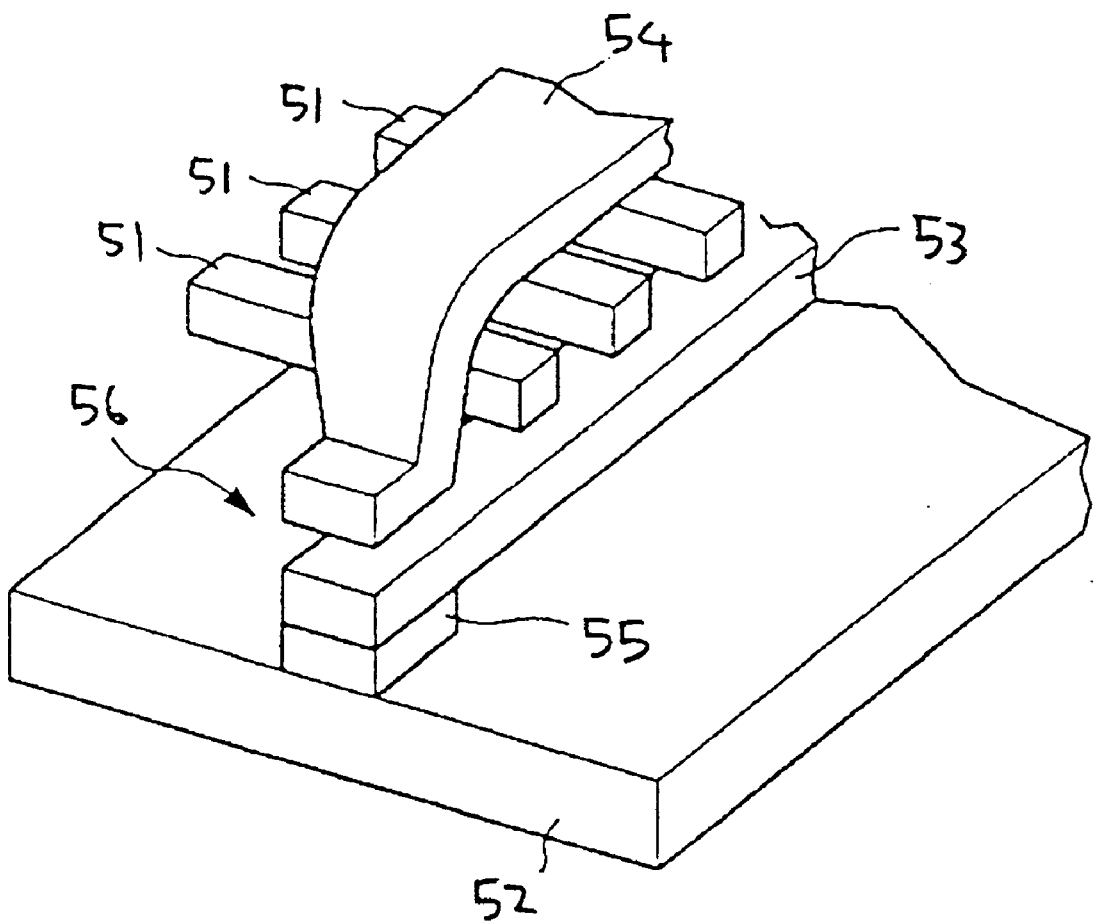
FIG. 28 is a conceptual view of the recording/reproducing head using the magnetoresistive head produced according to the present invention.

FIG. 28 is a conceptual view of the recording/reproducing head using the magnetoresistive head produced according to the present invention. The recording/reproducing head includes a reproducing head 55 formed on a substrate 52 and a recording head 56 having a magnetic pole 53, a coil 51, and an upper magnetic pole 54. Here, the upper shield film and the lower magnetic film may be formed as a single member or separate members. This recording/reproducing head writes a signal onto a recording medium and reads a signal from a recording medium. As shown in FIG. 28, a detection portion of the reproducing head 55 and a magnetic gap of the recording head 56 are superimposed on a slider and accordingly, they can be positioned simultaneously on a track. This recording/reproducing head is processed into a slider, which is mounted on a magnetic recording/reproducing apparatus.

Figure 29:
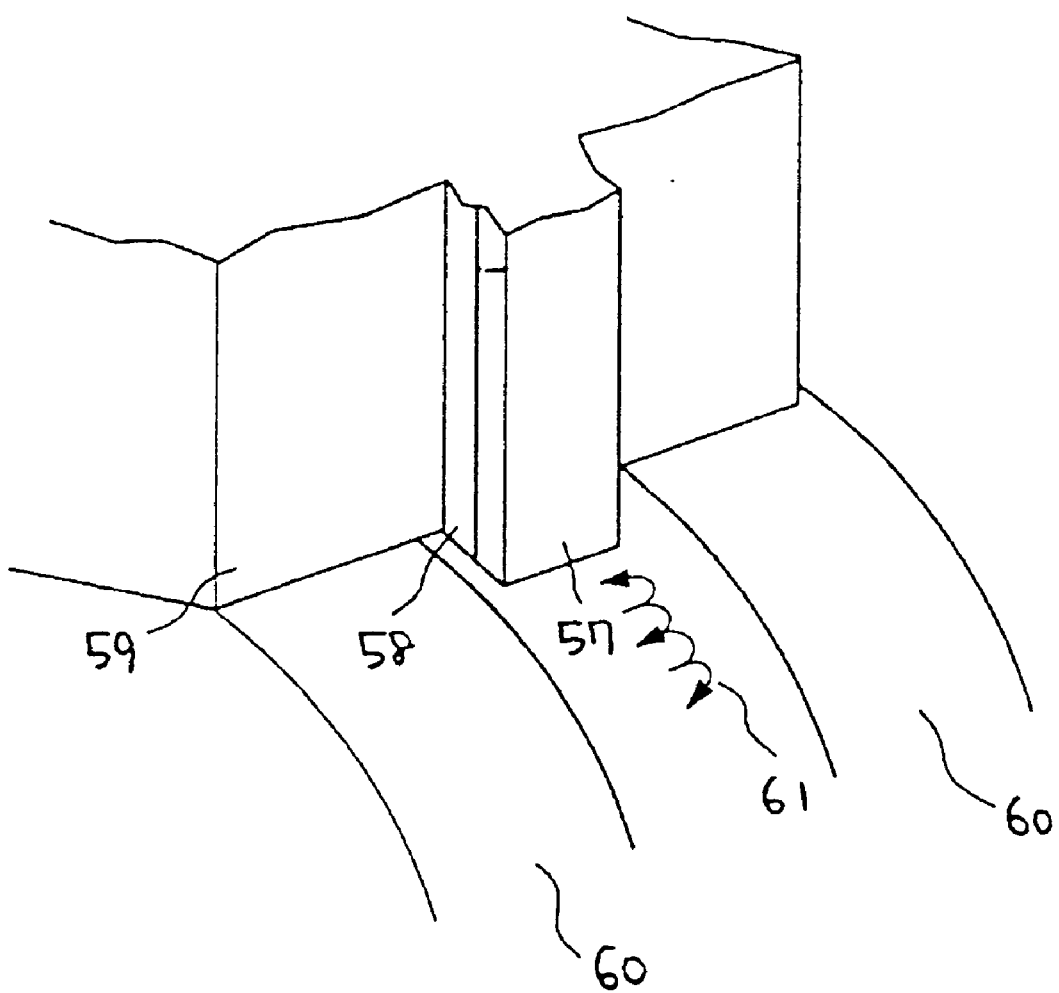
FIG. 29 is a conceptual view of the magnetic recording/reproducing apparatus using the magnetoresistive head produced according to the present invention.

FIG. 29 is a conceptual view of the magnetic recording/reproducing apparatus using the magnetoresistive head produced according to the present invention. A reproducing head 58 and a recording head 57 are formed on a substrate 59 also serving as a head slider, and this is positioned on a recording medium 60 for reproduction. The recording medium 60 rotates and the head slider relatively moves over the recording medium 60 at a height of 0.02 micrometers or below or in a contact state with the recording medium 60. With this mechanism, the reproducing head 58 is set at a position to read a magnetic signal recorded on the recording medium 60, from a stray magnetic field 61.

Figure 30:
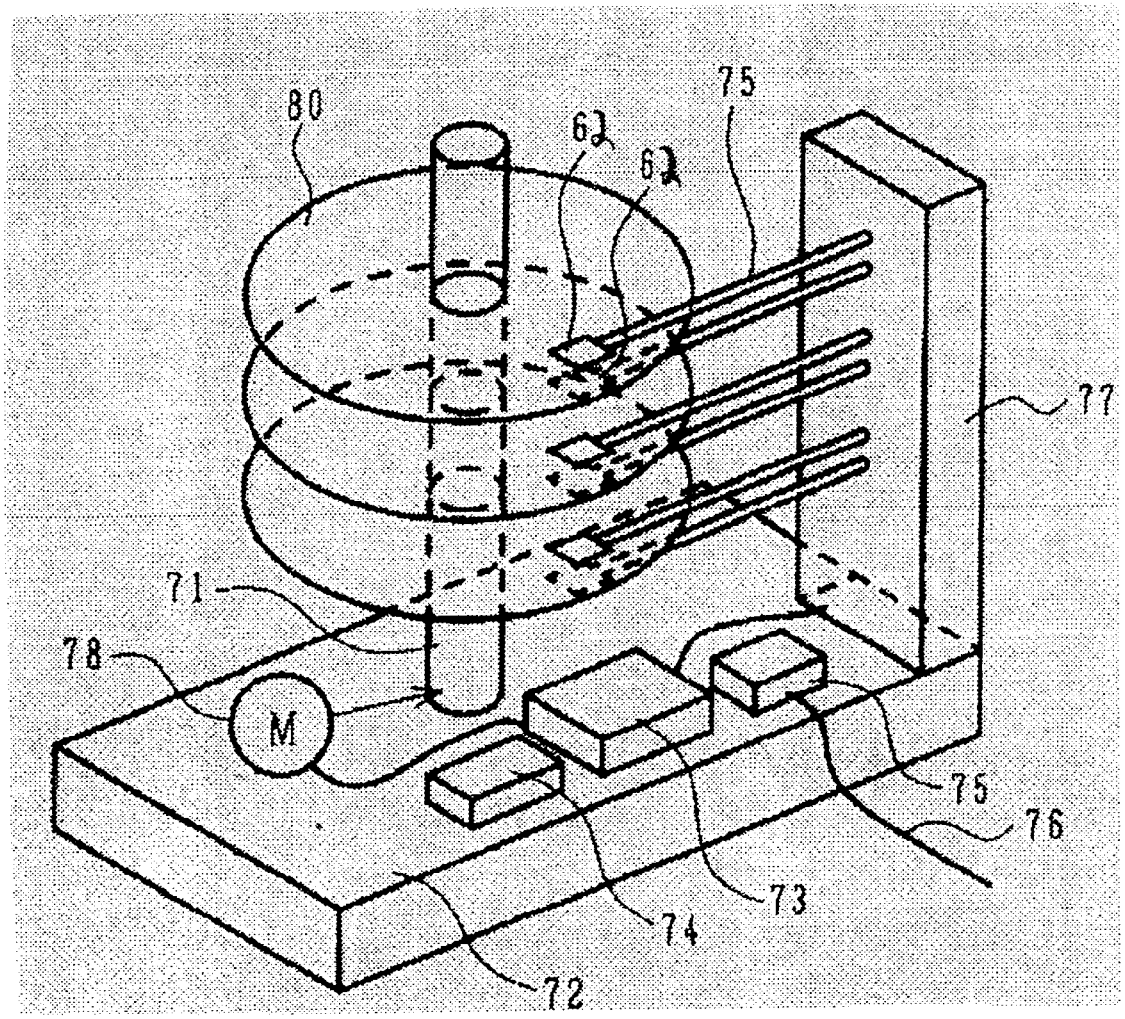
FIG. 30 is a perspective view of a magnetic disk apparatus prepared according to the present invention.

Next, an explanation will be given of a magnetic disk apparatus prepared according to the present invention as shown in FIG. 30. The magnetic disk apparatus comprises three magnetic disks 80 on its base 72 and at the back surface of the base 72, there are provided a drive circuit 73, a control/signal processing circuit 74, and an I/O interface 75. The magnetic disk apparatus is connected with the outside via a 32-bit bus line 76. Each of the magnetic disks 80 is sandwiched by a pair of heads 62 and accordingly, six heads 62 in all are arranged. A rotary actuator 77 for driving the heads 62, the control circuit 74, and a spindle 71 connected motor 78 for disk rotation are mounted. The disk 80 diameter is 46 mm and the data plane is between the diameters of 10 mm and 40 mm.

Because of the buried servo type not requiring a servo surface, it is possible to obtain a high density. This apparatus can directly be connected as an external storage apparatus for a small-size. For the I/O interface, a cache memory is mounted, corresponding to a bus line having a transfer speed of 5 to 20 mega bytes per second. Moreover, a plurality of the apparatus can be connected through an external controller so as to constitute a large-capacity magnetic disk apparatus.

According to the present invention, a reproducing head including a high electron mobility semiconductor element with higher sensitivity of magnetoresistance than a conventional one has been described above. A recording/reproducing system wherein a higher reproducing output than a conventional one from suitably recorded magnetic domain bits on a recording media can be obtained without destroying the prerecorded information data.

Moreover, the present invention enables one to produce the aforementioned magnetoresistive element with a preferable yield. The invention may be embodied in other specific forms without departing from the spirit or essential characteristic thereof. The present embodiments are therefore to be considered in all respects as illustrative and not restrictive, the scope of the invention being indicated by the appended claims rather than by foregoing description and all changes which come within the meaning and range of equivalency of the claims are therefore intended to be embraced therein.

What is claimed is:

1. A magnetoresistive sensor comprising: a magnetoresistive element and equipment which generates a magnetic field and supplies it to the magnetoresistive element thereby inducing a biasing magnetic field in said element, said magnetoresistive element including a high electron mobility semiconductor, a pair of electrodes connected to said semiconductor and generating a current path in said semiconductor, and another pair of electrodes connected to said semiconductor and detecting the voltage induced in said semiconductor.

2. The magnetoresistive sensor of claim 1 wherein said equipment is in contact with said magnetoresistive element directly or through a separation layer.

3. A magnetoresistive sensor as claimed in claim 1, wherein a high conduction material is attached to said high electron mobility semiconductor.

4. A magnetoresistive sensor as claimed in claim 3, wherein the high conduction material is a metal.

5. A magnetoresistive sensor as claimed in claim 4, wherein the amplitude of said biasing magnetic field induced in said element including high electron mobility semiconductor is 1 kOe or more.

6. A magnetoresistive sensor as claimed in claim 4, wherein the amplitude of said biasing magnetic field induced in said element including high electron mobility semiconductor is 2 kOe or more.

7. A magnetoresistive sensor as claimed in claim 3, wherein the amplitude of said biasing magnetic field induced in said element including high electron mobility semiconductor is 1 kOe or more.

8. A magnetoresistive sensor as claimed claim 3, wherein the amplitude of said biasing magnetic field induced in said element including high electron mobility semiconductor is 2 kOe or more.

9. A magnetoresistive sensor as claimed in claim 1, wherein a high conduction material is added to said high electron mobility semiconductor so that at least a part of the high conduction material is surrounded by said high electron mobility semiconductor.

10. A magnetoresistive sensor as claimed in claim 9, wherein the high conduction material is metal.

11. A magnetoresistive sensor as claimed in claim 9, wherein the amplitude of said biasing magnetic field induced in said/element including high electron mobility semiconductor is 1 kOe or more.

12. A magnetoresistive sensor as claimed in claim 9, wherein the amplitude of said biasing magnetic field induced in said element including high electron mobility semiconductor is 2 kOe or more.

13. A magnetoresistive sensor as claimed in claim 1, wherein the amplitude of said biasing magnetic field induced in said element including high electron mobility semiconductor is 1 kOe or more.

14. A magnetoresistive sensor as claimed in claim 1, wherein the amplitude of said biasing magnetic field induced in said element including high electron mobility semiconductor is 2 kOe or more.

15. A recording and reproducing system comprising: a recording medium wherein a magnetization direction in a recorded magnetic domain bit in the recording medium is parallel, anti-parallel, nearly parallel or nearly anti-parallel to the moving direction of said medium, a reproducing head having a magnetoresistive sensor as claimed in claim 4, and wherein the maximum amplitude of the biasing magnetic field on the surface of the recording medium induced by the biasing magnet in said magnetoresistive sensor is smaller than the critical magnetic field where the magnetization of the recording layer in said medium starts to reverse.

16. A recording and reproducing system claimed in claim 15, wherein the critical magnetic field where the magnetization of the recording layer in said medium starts to reverse is more than 3 kOe.

17. A recording and reproducing system claimed in claim 15, wherein the critical magnetic field where the domain wall of the prerecorded magnetic domain bit in said medium starts to move is more than 3 kOe.

18. A recording and reproducing system claimed in claim 15, wherein the coercive force of said recording medium is more than 3 kOe.

19. A recording and reproducing system claimed in claim 15, wherein a material which saturation magnetization is over 1.8 T is used as a part of the write pole near the write gap.

20. A recording and reproducing system claimed in claim 15, wherein NiFeCo is used as a part of the write pole near the write gap.

21. A recording and reproducing system comprising: a recording medium wherein a magnetization direction in a recorded magnetic domain bit in the recording medium is parallel, anti-parallel, nearly parallel or nearly anti-parallel to the moving direction of said medium, a reproducing head having a magnetoresistive sensor as claimed in claim 1, and wherein the maximum amplitude of the biasing magnetic field on the surface of the recording medium induced by the biasing magnet in said magnetoresistive sensor is smaller than the critical magnetic field where the domain wall of the prerecorded magnetic domain bit in said medium start to move.

22. A recording and reproducing system claimed in claim 21, wherein the critical magnetic field where the magnetization of the recording layer in said medium starts to reverse is more than 3 kOe.

23. A recording and reproducing system claimed in claim 21, wherein the critical magnetic field where the domain wall of the prerecorded magnetic domain bit in said medium starts to move is more than 3 kOe.

24. A recording and reproducing system claimed in claim 21, wherein the coercive force of said recording medium is more than 3 kOe.

25. A recording and reproducing system claimed in claim 21, wherein a material which saturation magnetization is over 1.8 T is used as a part of the write pole near the write gap.

26. A recording and reproducing system claimed in claim 21, wherein a NiFeCo is used as a part of the write pole near the write gap.

27. A recording and reproducing system comprising: a recording medium wherein a magnetization direction in a recorded magnetic domain bit in the recording medium is parallel, anti-parallel, nearly parallel or nearly anti-parallel to the moving direction of said medium, a reproducing head having a magnetoresistive sensor as claimed in claim 1, and wherein the maximum amplitude of the biasing magnetic field on the surface of the recording medium induced by the biasing magnet in said magnetoresistive sensor is smaller than the coercive force of said medium.

28. A recording and reproducing system claimed in claim 27, wherein the critical magnetic field where the magnetization of the recording layer in said medium starts to reverse is more than 3 kOe.

29. A recording and reproducing system claimed in claim 27, wherein the critical magnetic field where the domain wall of the prerecorded magnetic domain bit in said medium starts to move is more than 3 kOe.

30. A recording and reproducing system claimed in claim 27, wherein the coercive force of said recording medium is more than 3 kOe.

31. A recording and reproducing system claimed in claim 27, wherein a material which saturation magnetization is over 1.8 T is used as a part of the write pole near the write gap.

32. A recording and reproducing system claimed in claim 27, wherein NiFeCo is used as a part of the write pole near the write gap.

33. A recording and reproducing system comprising: a recording medium wherein a magnetization direction in a recorded magnetic domain bit in the recording medium is parallel, anti-parallel, nearly parallel or nearly anti-parallel to the moving direction of said medium, a reproducing head having a magnetoresistive sensor as claimed in claim 1, and wherein the maximum amplitude of the biasing magnetic field in said magnetoresistive element including a high electron mobility semiconductor in said magnetoresistive sensor induced by the biasing magnet in said magnetoresistive sensor is smaller than the critical magnetic field where the magnetization of the recording layer in said medium starts to reverse.

34. A recording and reproducing system claimed in claim 33, wherein the critical magnetic field where the magnetization of the recording layer in said medium starts to reverse is more than 3 kOe.

35. A recording and reproducing system claimed in claim 33, wherein the critical magnetic field where the domain wall of the prerecorded magnetic domain bit in said medium starts to move is more than 3 kOe.

36. A recording and reproducing system claimed in claim 33, wherein the coercive force of said recording medium is more than 3 kOe.

37. A recording and reproducing system claimed in claim 33, wherein a material which saturation magnetization is over 1.8 T is used as a part of the write pole near the write gap.

38. A recording and reproducing system claimed in claim 33, wherein NiFeCo is used as a part of the write pole near the write gap.

39. A recording and reproducing system comprising: a recording medium wherein a magnetization direction in a recorded magnetic domain bit in a recording medium is parallel, anti-parallel, nearly parallel or nearly anti-parallel to the moving direction of said medium, a reproducing head having a magnetoresistive sensor as claimed in claim 1, and wherein the maximum amplitude of the biasing magnetic field in said magnetoresistive element including a high electron mobility semiconductor in said magnetoresistive sensor induced by the biasing magnet in said magnetoresistive sensor is smaller than the critical magnetic field where the domain wall of the prerecorded magnetic domain bit in said medium start to move.

40. A recording and reproducing system claimed in claim 39, wherein the critical magnetic field where the magnetization of the recording layer in said medium starts to reverse is more than 3 kOe.

41. A recording and reproducing system claimed in claim 39, wherein the critical magnetic field where the domain wall of the prerecorded magnetic domain bit in said medium starts to move is more than 3 kOe.

42. A recording and reproducing system claimed in claim 39, wherein the coercive force of said recording medium is more than 3 kOe.

43. A recording and reproducing system claimed in claim 39, wherein a material which saturation magnetization is over 1.8 T is used as a part of the write pole near the write gap.

44. A recording and reproducing system claimed in claim 39, wherein NiFeCo is used as a part of the write pole near the write gap.

45. A recording and reproducing system comprising: a recording medium wherein a magnetization direction in a recorded magnetic domain bit in the recording medium is a parallel, anti-parallel, nearly parallel or nearly anti-parallel to the moving direction of said medium, a reproducing head having a magnetoresistive sensor as claimed in claim 1, and wherein the maximum amplitude of the biasing magnetic field in said magnetoresistive element including a high electron mobility semiconductor in said magnetoresistive sensor induced by the biasing magnet in said magnetoresistive sensor is smaller than the coercive force of said medium.

46. A recording and reproducing system claimed in claim 45, wherein the critical magnetic field where the magnetization of the recording layer in said medium starts to reverse is more than 3 kOe.

47. A recording and reproducing system claimed in claim 45, wherein the critical magnetic field where the domain wall of the prerecorded magnetic domain bit in said medium starts to move is more than 3 kOe.

48. A recording and reproducing system claimed in claim 45, wherein the coercive force of said recording medium is more than 3 kOe.

49. A recording and reproducing system claimed in claim 45, wherein a material which saturation magnetization is over 1.8 T is used as a part of the write pole near the write gap.

50. A recoding and reproducing system claimed in claim 45, wherein NiFeCo is used as a part of the write pole near the write gap.

51. A recording and reproducing system comprising: a recording medium wherein a magnetization direction in the recorded domain is perpendicular or nearly perpendicular to the medium surface, a reproducing head having a magnetoresistive sensor as claimed in claim 1, and wherein the maximum amplitude of the biasing magnetic field on the surface of the recording medium induced by the biasing magnet in said magnetoresistive sensor is smaller than the critical magnetic field where the magnetization of recording layer in said medium starts to reverse.

52. A recording and reproducing system claimed in claim 51, wherein the critical magnetic field where the magnetization of the recording layer in said medium starts to reverse is more than 3 kOe.

53. A recording and reproducing system claimed in claim 51, wherein the critical magnetic field where the domain wall of the prerecorded magnetic domain bit in said medium starts to move is more than 3 kOe.

54. A recording and reproducing system claimed in claim 51, wherein the coercive force of said recording medium is more than 3 kOe.

55. A recording and reproducing system claimed in claim 51, wherein a material which saturation magnetization is over 1.8 T is used as a part of the write pole near the write gap.

56. A recording and reproducing system claimed in claim 51, wherein NiFeCo is used as a part of the write pole near the write gap.

57. A recording and reproducing system comprising: a recording medium wherein a magnetization direction in the recorded domain is perpendicular or nearly perpendicular to the medium surface, a reproducing head having a magnetoresistive sensor as claimed in claim 1, and wherein the maximum amplitude of the biasing magnetic field on the surface of the recording medium induced by the biasing magnet in said magnetoresistive sensor is smaller than the critical magnetic field where the domain wall of the prerecorded magnetic domain bit in said medium start to move.

58. A recording and reproducing system claimed in claim 57, wherein the critical magnetic field where the magnetization of the recording layer in said medium starts to reverse is more than 3 kOe.

59. A recording and reproducing system claimed in claim 57, wherein the critical magnetic field where the domain wall of the prerecorded magnetic domain bit in said medium starts to move is more than 3 kOe.

60. A recording and reproducing system claimed in claim 57, wherein the coercive force of said recording medium is more than 3 kOe.

61. A recording and reproducing system claimed in claim 57, wherein a material which saturation magnetization is over 1.8 T is used as a part of the write pole near the write gap.

62. A recording and reproducing system claimed in claim 57, wherein NiFeCo is used as a part of the write pole near the write gap.

63. A recording and reproducing system comprising: a recording medium wherein a magnetization direction in the recorded domain is perpendicular or nearly perpendicular to the medium surface, a reproducing head having a magnetoresistive sensor as claimed in claim 1, and wherein the maximum amplitude of the biasing magnetic field on the surface of the recording medium induced by the biasing magnet in said magnetoresistive sensor is smaller than the coercive force of said medium.

64. A recording and reproducing system claimed in claim 63, wherein the critical magnetic field where the magnetization of the recording layer in said medium starts to reverse is more than 3 kOe.

65. A recording and reproducing system claimed in claim 63, wherein the critical magnetic field where the domain wall of the prerecorded magnetic domain bit in said medium starts to move is more than 3 kOe.

66. A recording and reproducing system claimed in claim 63, wherein the coercive force of said recording medium is more than 3 kOe.

67. A recording and reproducing system claimed in claim 63, wherein a material which saturation magnetization is over 1.8 T is used as a part of the write pole near the write gap.

68. A recording and reproducing system claimed in claim 63, wherein NiFeCo is used as a part of the write pole near the write gap.

69. A recording and reproducing system comprising: a recording medium wherein a magnetization direction in the recorded domain is perpendicular or nearly perpendicular to the medium surface, a reproducing head having magnetoresistive sensor as claimed in claim 1, and wherein the maximum amplitude of the biasing magnetic field in said magnetoresistive element including a high electron mobility semiconductor in said magnetoresistive sensor induced by the biasing magnet in said magnetoresistive sensor is smaller than the critical magnetic field where the magnetization of the recording layer in said medium start to reverse.

70. A recording and reproducing system claimed in claim 69, wherein the critical magnetic field where the magnetization of the recording layer in said medium starts to reverse is more than 3 kOe.

71. A recording and reproducing system claimed in claim 69, wherein the critical magnetic field where the domain wall of the prerecorded magnetic domain bit in said medium starts to move is more than 3 kOe.

72. A recording and reproducing system claimed in claim 69, wherein the coercive force of said recording medium is more than 3 kOe.

73. A recording and reproducing system claimed in claim 69, wherein a material which saturation magnetization is over 1.8 T is used as a part of the write pole near the write gap.

74. A recording and reproducing system claimed in claim 69, wherein NiFeCo is used as a part of the write pole near the write gap.

75. A recording and reproducing system comprising: a recording medium wherein a magnetization direction in the recorded domain is perpendicular or nearly perpendicular to the medium surface, a reproducing head having a magnetoresistive sensor as claimed in claim 1, and wherein the maximum amplitude of the biasing magnetic field in said magnetoresistive element including a high electron mobility semiconductor in said magnetoresistive sensor induced by the biasing magnet in said magnetoresistive sensor is smaller than the critical magnetic field where the domain wall of the prerecorded magnetic domain bit in said medium start to move.

76. A recording and reproducing system claimed in claim 75, wherein the critical magnetic field where the magnetization of the recording layer in said medium starts to reverse is more than 3 kOe.

77. A recording and reproducing system claimed in claim 75, wherein the critical magnetic field where the domain wall of the prerecorded magnetic domain bit in said medium starts to move is more than 3 kOe.

78. A recording and reproducing system claimed in claim 75, wherein the coercive force of said recording medium is more than 3 kOe.

79. A recording and reproducing system claimed in claim 75, wherein a material which saturation magnetization is over 1.8 T is used as a part of the write pole near the write gap.

80. A recording and reproducing system claimed in claim 75, wherein NiFeCo is used as a part of the write pole near the write gap.

81. A recording and reproducing system comprising: a recording medium wherein a magnetization direction in the recorded domain is perpendicular or nearly perpendicular to the medium surface, a reproducing head having a magnetoresistive sensor as claimed in claim 1, and wherein the maximum amplitude of the biasing magnetic field in said magnetoresistive element including a high electron mobility semiconductor in said magnetoresistive sensor induced by the biasing magnet in said magnetoresistive sensor is smaller than the coercive force of said medium.

82. A recording and reproducing system claimed in claim 81, wherein the critical magnetic field where the magnetization of the recording layer in said medium starts to reverse is more than 3 kOe.

83. A recording and reproducing system claimed in claim 81, wherein the critical magnetic field where the domain wall of the prerecorded magnetic domain bit in said medium starts to move is more than 3 kOe.

84. A recording and reproducing system claimed in claim 81, wherein the coercive force of said recording medium is more than 3 kOe.

85. A recording and reproducing system claimed in claim 81, wherein a material which saturation magnetization is over 1.8 T is used as a part of the write pole near the write gap.

86. A recording and reproducing system claimed in claim 81, wherein NiFeCo is used as a part of the write pole near the write gap.

87. A magnetic recording/reproducing apparatus comprising:

a magnetic recording medium having a plurality of tracks for recording data;

a magnetic recording head for storing data in the magnetic recording medium;

a magnetoresistive sensor claimed in claim 1 and actuator means for moving the magnetic recording head and the magnetoresistive sensor to a desired track on the magnetic recording medium.

88. A magnetic/recording/reproducing apparatus as claimed in claim 87, wherein the magnetic recording medium is a hard disk.

89. A magnetoresistive sensor including, a magnetic shield and a magnetoresistive element which includes a high electron mobility semiconductor and electrodes connected to said semiconductor and generating a current path in said semiconductor, wherein the magnetic shield is in common with an electrode connected to said semiconductor and generating a current path in said semiconductor and/or detecting the voltage induced in said semiconductor.

90. A magnetoresistive sensor claimed in claim 89, wherein the magnetic shield surrounds the surface of said magnetoresistive element.

* * * * *